United States Patent
Hiraoka et al.

(10) Patent No.: US 6,899,999 B2
(45) Date of Patent: May 31, 2005

(54) METHOD OF MANUFACTURING COMPOSITE MEMBER, PHOTOSENSITIVE COMPOSITION, POROUS BASE MATERIAL, INSULATING BODY AND COMPOSITE MEMBER

(75) Inventors: Toshiro Hiraoka, Fujisawa (JP); Koji Asakawa, Kawasaki (JP); Yasuyuki Hotta, Tokyo (JP); Shigeru Matake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 344 days.

(21) Appl. No.: 10/091,481

(22) Filed: Mar. 7, 2002

(65) Prior Publication Data

US 2003/0022102 A1 Jan. 30, 2003

(30) Foreign Application Priority Data

Mar. 28, 2001 (JP) ........................................ 2001-092715
Mar. 28, 2001 (JP) ........................................ 2001-093668

(51) Int. Cl.$^7$ .............................. G03F 7/00; G03F 7/04
(52) U.S. Cl. ..................... 430/311; 430/330; 430/270.1
(58) Field of Search ................................ 430/330, 311, 430/770.1

(56) References Cited

U.S. PATENT DOCUMENTS

| | | | | |
|---|---|---|---|---|
| 5,415,971 A | * | 5/1995 | Couture et al. | 430/260 |
| 5,473,120 A | * | 12/1995 | Ito et al. | 174/264 |
| 5,498,467 A | * | 3/1996 | Meola | 428/198 |
| 5,697,390 A | * | 12/1997 | Garrison et al. | 132/321 |
| 6,465,742 B1 | * | 10/2002 | Hiraoka et al. | 174/255 |
| 6,649,516 B2 | * | 11/2003 | Asakawa et al. | 438/638 |
| 6,660,545 B2 | * | 12/2003 | Furusawa | 438/21 |
| 6,709,806 B2 | * | 3/2004 | Hotta et al. | 430/322 |

FOREIGN PATENT DOCUMENTS

JP 6-202343 7/1994

OTHER PUBLICATIONS

U.S. Appl. No. 09/651,030, filed Aug. 30, 2000, allowed.
U.S. Appl. No. 09/927,937, filed Aug. 13, 2001, pending.
U.S. Appl. No. 10/161,707, filed Jun. 5, 2002, pending.
U.S. Appl. No. 10/611,895, filed Jul. 3, 2003, Hiraoka et al.
U.S. Appl. No. 09/808,233, filed Mar. 15, 2001, pending.
U.S. Appl. No. 10/694,776, filed Oct. 29, 2003, Hiraoka et al.

* cited by examiner

*Primary Examiner*—Amanda Walke
(74) *Attorney, Agent, or Firm*—Oblon, Spivak, McClelland, Maier & Neustadt, P.C.

(57) ABSTRACT

Disclosed is a method of manufacturing a composite member having a conductive pattern, comprising (1) forming on a surface of an insulating body a photosensitive layer containing both a photosensitive compound forming an ion-exchange group upon irradiation with an energy beam and a crosslinkable compound having a crosslinkable group, (2) forming a pattern of ion-exchange groups by selectively exposing the photosensitive layer to an energy beam so as to form an ion-exchange group in the exposed portion, (3) crosslinking the crosslinkable compound contained in at least the exposed portion of the photosensitive layer, (4) allowing metal ions, or a metal colloid to be adsorbed on the pattern of ion-exchange groups formed by the selectively exposing, and (5) forming a composite member having conductive pattern by depositing a conductive material on the pattern of ion-exchange groups having the metal ions, or the metal colloid adsorbed thereon using an electroless plating.

19 Claims, 1 Drawing Sheet

METHOD OF MANUFACTURING COMPOSITE MEMBER, PHOTOSENSITIVE COMPOSITION, POROUS BASE MATERIAL, INSULATING BODY AND COMPOSITE MEMBER

CROSS-REFERENCE TO RELATED APPLICATIONS

This application is based upon and claims the benefit of priority from the prior Japanese Patent Applications No. 2001-092715, filed Mar. 28, 2001; and No. 2001-093668, filed Mar. 28, 2001, the entire contents of both of which are incorporated herein by reference.

BACKGROUND OF THE INVENTION

1. Field of the Invention

The present invention relates to a method of manufacturing a composite member, particularly, to a method of manufacturing a composite member having a flexible substrate, a multi-layered wiring board, an interposer, a fine wiring pattern such as three-dimensional wiring, an antenna, a coil, a sensor and a fine wiring pattern such as a micromachine. The present invention also relates to a photosensitive composition and a porous base material suitable for use in the manufacturing method of the composite member of the present invention.

2. Description of the Related Art

The present invention also relates to a method of manufacturing a composite member having a conductive portion such as wiring formed in an insulating body and used in the fields of, for example, electric appliances, electronic appliances and communication, to a photosensitive composition suitable for use in the manufacturing method of the composite member, to an insulating body used for the manufacture of the composite member, and to a composite member.

A method that permits manufacturing a fine wiring pattern at low cost is absolutely necessary for the miniaturization of electronic appliances such as portable telephones and a wearable computers. The method of manufacturing a wiring pattern at low cost is also indispensable for the manufacture of, for example, DNA chips and various sensors. Also, for the manufacture of various antennas and coils, it is necessary to form wiring a three-dimensionally on a steric member. The manufacturing technology of such a three-dimensional wiring is also important in the case of forming wiring on the casing of an electronic appliance and for the wiring on a micromachine or an optoelectronic device.

The wiring pattern is manufactured in general by forming a Cu layer on a substrate, followed by etching the Cu layer with a resist pattern used as a mask. However, this technology is troublesome. In addition, it is difficult to form a fine wiring pattern and a three-dimensional wiring pattern by this technology. Proposed as a method of manufacturing a wiring pattern, which permits forming three-dimensional wiring at low cost, is a method of selectively applying an electroless plating to the light exposed portion or unexposed portion. In this method, a photosensitive layer formed on a substrate is exposed to light so as to form a pattern of an ion-exchange group, followed by allowing the ion-exchange group to adsorb metal ions or a metal colloid. Then, an electroless plating is applied with the adsorbed metal ions or the metal colloid used as the catalytic nucleus of the plating so as to form a wiring pattern.

This technology permits eliminating the resist pattern formation and the etching so as to render the process very simple, with the result that the manufacturing cost can be lowered. In addition, this technology makes it possible to achieve easily miniaturization of the wiring pattern and the formation of a three-dimensional wiring pattern. However, a serious problem remains unsolved in this technology. It should be noted that, in order to perform satisfactory plating, it is necessary to increase the adsorption amount of the catalytic nuclei. If the amount of the ion-exchange groups is increased in order to increase the adsorption amount of the catalytic nuclei, the photosensitive layer is dissolved in the plating solution and, thus, tends to peel off. It is certainly possible to avoid the peeling of the photosensitive layer by modifying the surface of the substrate so as to introduce directly the ion-exchange groups as disclosed in, for example, Japanese Patent Disclosure (Kokai) No. 7-207450 or Japanese Patent Disclosure (Kokai) No. 11-246977, or by using as a photosensitive layer the monomolecular layer of the ion-exchange groups chemically coupled with the substrate surface, as disclosed in, for example, Japanese Patent Disclosure No. 6-202343. However, since the amount of the ion-exchange groups is small, the adsorption amount of the catalytic nuclei is not sufficiently large, resulting in failure to achieve satisfactory plating. In conclusion, the conventional method is incapable of satisfying simultaneously both the improvement in the adsorption amount of the catalytic nuclei and the improvement in the resistance of the photosensitive layer to the plating solution.

As described above, the conventional selective electroless plating is low in cost and certainly permits forming a three-dimensional wiring pattern. However, this conventional method gives rise to the problem that, if the amount of the ion-exchange groups is increased in order to increase the adsorption amount of the catalytic nuclei, the photosensitive layer is dissolved in the plating solution.

Incidentally, it was customary in the past to form the via in steric wiring as follows. In the first step, a via hole is formed in an insulating body by a photolithography process using a photosensitive polyimide or resist. Then, a via is formed by selectively applying plating to the via hole or by loading a conductive paste in the via hole. Forming a via by this method requires a resist coating step, a light exposure step and an etching step. Therefore, the via formation is laborious and it is difficult to improve the yield.

In another method of the via formation, a via hole of a predetermined size is formed in an insulating body by using a drill or a $CO_2$ laser, followed by applying plating to the via hole or loading a conductive paste in the via hole. In the method utilizing formation of a via hole in an insulating body, however, it is difficult to form freely a fine via not larger than scores of microns in a desired position.

In the method disclosed in Japanese Patent Disclosure No. 7-207450 referred to previously, a compound having hydrophilic radicals is allowed to permeate the pores of a three-dimensional porous film such as a PTFE film. Under this condition, the three-dimensional porous film is selectively exposed to light in a pattern by using a low-pressure mercury lamp having wavelengths of 185 nm and 254 nm. As a result, hydrophilic radicals are formed on the three-dimensional porous film. Further, metal plating is applied to the three-dimensional porous film.

In the conventional method described above, however, light having a short wavelength is used for the light exposure, with the result that the material constituting the three-dimensional porous film is caused to deteriorate. An additional problem to be noted is that the light used for the light exposure is absorbed by the three-dimensional porous film, resulting in failure to permeate deep inside the porous body. It follows that it is impossible to form a fine via.

Another method of forming a via is disclosed in U.S. Pat. No. 5,498,467. In this method, the entire surface of an insulating body made of a porous material is impregnated with a photosensitive composition containing a photosensitive reducing agent, a metal salt, etc., followed by applying an after-pattern light exposure so as to reduce the cation of the metal salt in the light-exposed portion into a metal nucleus. Then, the photosensitive composition in the unexposed portion is removed by washing, followed by applying electroless plating or soldering to the residual metal nuclei so as to form vias of a predetermined pattern.

In the conventional method described above, however, the entire surface of an insulating body formed of a porous material is impregnated with a photosensitive composition containing a metal salt. Therefore, it is difficult to remove completely the metal salt adsorbed on the portion corresponding to the unexposed portion after the light exposure. It follows that a phenomenon that metal nuclei are precipitated on an undesired portion takes place in the subsequent reducing step. The abnormal precipitation of the metal nuclei gives rise to a problem in the insulating characteristics between the adjacent vias and between the adjacent wiring layers in accordance with miniaturization of the pattern.

BRIEF SUMMARY OF THE INVENTION

An object of the present invention is to provide a method of manufacturing a composite member having a conductive pattern formed on a base material of an insulating body, i.e., a method of manufacturing a composite member capable of forming a fine three-dimensional wiring pattern at low cost without causing the photosensitive layer to be dissolved in a plating solution so as to be peeled off.

Another object of the present invention is to provide a photosensitive composition and a porous substrate used suitably in the above-noted method of manufacturing a composite member having a conductive pattern.

Another object of the present invention is to provide a composite member having a conductive pattern manufactured by the method described above.

Another object of the present invention is to provide a method of manufacturing a composite member allowing a high degree of freedom in the design of a conductive circuit, free from deterioration of the insulating body caused by light exposure, and free from an abnormal precipitation of a metal on the insulating body so as to make it possible to form easily a conductive portion having a fine pattern.

Another object of the present invention is to provide a photosensitive composition and an insulating body used for the manufacture of the composite member having a conductive pattern noted above.

Further, still another object of the present invention is to provide a composite member manufactured by the method described above.

According to an aspect of the present invention, there is provided a method of manufacturing a composite member having a conductive pattern, comprising:

(1) forming on a surface of an insulating body a photosensitive layer containing both a photosensitive compound forming an ion-exchange group or causing an ion-exchange group to disappear upon irradiation with an energy beam and a crosslinkable compound having a crosslinkable group;

(2) forming a pattern of ion-exchange groups by selectively exposing the photosensitive layer to an energy beam so as to form an ion-exchange group in the exposed portion or to cause an ion-exchange group to disappear from the exposed portion;

(3) crosslinking the crosslinkable compound contained in at least the exposed portion of the photosensitive layer;

(4) allowing metal ions, a metal compound, or a metal colloid to be adsorbed on the pattern of ion-exchange groups formed by the selectively exposing; and (5) forming a composite member having conductive pattern by depositing a conductive material on the pattern of ion-exchange groups having the metal ions, the metal compound, or the metal colloid adsorbed thereon using an electroless plating.

According to another aspect of the present invention, there is provided a method of manufacturing a composite member having a conductive pattern, comprising:

(1) forming on a surface of an insulating body a photosensitive layer containing a photosensitive polymer having both a photosensitive group capable of forming an ion-exchange group or causing an ion-exchange group to disappear upon irradiation with an energy beam and a crosslinkable group;

(2) forming a pattern of ion-exchange groups by selectively exposing the photosensitive layer to an energy beam so as to form an ion-exchange group in the exposed portion or to cause an ion-exchange group to disappear from the exposed portion;

(3) crosslinking the crosslinkable group contained in at least the exposed portion of the photosensitive layer;

(4) allowing metal ions, a metal compound, or a metal colloid to be adsorbed on the pattern of ion-exchange groups formed by the selectively exposing in a pattern; and (5) forming a composite member having conductive pattern by depositing a conductive material on the pattern of ion-exchange groups having the metal ions, the metal compound, or the metal colloid adsorbed thereon using electroless plating.

According to another aspect of the present invention, there is provided a photosensitive composition, comprising:

a polymer having a photosensitive group forming an ion-exchange group upon irradiation with an energy beam and an crosslinkable group capable of a radical polymerization; and a radical generating agent.

According to another aspect of the present invention, there is provided a porous substrate, comprising:

a porous body having voids; and a photosensitive layer formed on the inner surface of the voids, wherein the photosensitive layer containing a composition having both a photosensitive compound capable of forming an ion-exchange group or causing an ion-exchange group to disappear upon irradiation with an energy beam and a crosslinkable compound, or containing a photosensitive polymer having both photosensitive group capable of forming an ion-exchange group or causing an ion-exchange group to disappear upon irradiation with an energy beam and a crosslinkable group.

According to another aspect of the present invention, there is provided a porous substrate, comprising:

a porous body having voids; and a photosensitive layer formed on the inner surface of the voids, wherein the photosensitive layer contains a polymer having a photosensitive group capable of generating an ion-exchange group upon irradiation with an energy beam and a radical polymerizable group, and a radical generating agent.

According to another aspect of the present invention, there is provided a method of manufacturing a composite member having a conductive pattern, comprising:

(1) forming on a surface of an insulating body a photosensitive layer containing a photo acid generating agent and a compound forming an ion-exchange group in the presence of an acid;

(2) selectively exposing said photosensitive layer to an energy beam so as to generate an acid in the exposed portion;

(3) forming a pattern of ion-exchange groups by allowing the acid generated by the selectively exposing in the exposed portion of the photosensitive layer to form an ion-exchange group; and (4) forming a composite member having conductive pattern by allowing a metal ion, a metal compound, or a metal colloids to be adsorbed on the pattern of ion-exchange groups, wherein the compound forming an ion-exchange group in the presence of the acid is a copolymer having a first repeating unit having ion-exchange groups and a second repeating unit having an atomic group not decomposed by an acid and insoluble in an alkali, and some or all of said ion-exchange groups are protected by a protective group.

According to another aspect of the present invention, there is provided photosensitive composition comprising, a photo acid generating agent, a high molecular weight compound capable of forming ion-exchange groups in the presence of an acid, and a photosensitizer, wherein the photosensitive composition is sensitive to light having a wavelength not shorter than 450 nm, said high molecular weight compound is a copolymer having a first repeating unit having ion-exchange groups and a second repeating unit having an atomic group not decomposed by an acid and insoluble in an alkali, and some or all of said ion-exchange groups are protected by a protective group.

According to another aspect of the present invention, there is provided an insulating body used for the manufacture of a composite member having a conductive pattern comprising a porous body and the coating layer on the inner surface of the pore of said porous body, wherein the coating layer formed with the photosensitive composition described above.

Further, according to still another aspect of the present invention, there is provided a composite member manufactured by the method described above.

DETAILED DESCRIPTION OF THE INVENTION

Figure 1A:
FIGS. 1A to 1E are cross-sectional views collectively showing a method of manufacturing a composite member according to one embodiment of the present invention.

In one embodiment of the present invention, a conductive portion having a fine pattern is formed in an insulating body by performing at least steps (1) to (5) given below. The following description covers the case of using a photosensitive composition containing a compound capable of forming ion-exchange groups upon irradiation with an energy beam.

Step (1): In the first step, a photosensitive layer containing a compound capable of forming ion-exchange groups upon irradiation with an energy beam is formed on the surface of an insulating substrate. The photosensitive layer formed in this step is a photosensitive composition layer. The shape of the substrate is not particularly limited. It is possible to use substrates of various shapes such as plate-like, linear, cylindrical and spherical substrates. In the case of using a porous substrate, it is possible to form a conductive pattern within the porous body, too.

Step (2): In the next step, the photosensitive composition layer formed on the substrate is selectively exposed to light (an energy beam such as light) in a pattern so as to form ion-exchange groups in the exposed portion of the photosensitive composition layer. Where the substrate is porous, it is also possible for the inner region of the substrate to be exposed to light. The selective light exposure in a pattern can be performed by using a light exposure mask or by scanning a laser beam. It is possible to modulate the light emitted from the light source by using a mirror array formed by arranging a large number of fine mirrors. In the case of using a porous substrate, it is also possible to form a conductive pattern within the porous body because the exposing light permeates into the inner region of the porous body.

Step (3): Then, the crosslinkable compound contained in the photosensitive composition layer is crosslinked. It is possible to carry out the crosslinking before or simultaneously with the light exposure step. By the crosslinking of the crosslinkable compound, it is possible to improve the resistance of the photosensitive layer to the plating solution.

Step (4): Metal ions, metal compound, metal colloid is allowed to be adsorbed the ion-exchange groups formed in the light-exposed portion. The metal ions or metal compounds form a salt or a covalent bond together with the ion-exchange group so as to be adsorbed. The metal colloid is generally charged and, thus, are electrostatically adsorbed on the ionized ion-exchange group. These metal ions, metal compound and metal colloid perform the function of a catalytic nucleus of the electroless plating. Where the metal ions and metal compound are adsorbed, it is possible to apply a reducing treatment as required so as to convert the metal ions and metal compound into metal, thereby improving the catalytic function of the electroless plating.

Step (5): An electroless plating is applied with the metal ions, the metal compound or the metal colloid adsorbed on the ion-exchange group in the exposed portion used as a catalytic nucleus.

Incidentally, in the case of using a photosensitive composition containing a compound causing an ion-exchange group to disappear upon exposure to light, the ion-exchange group in the exposed portion is caused to disappear in the selective light exposure in a pattern in step (2) described above, with the result that the ion-exchange groups are allowed to remain selectively in the unexposed portion, thereby forming a negative pattern.

It is also possible to allow the ion-exchange groups formed in the exposed portion by the selective light exposure in a pattern to react selectively with, for example, a fluorine compound so as to eliminate the ion exchange capability. Then, ion-exchange groups are generated in the unexposed portion in the selective light exposure step in a pattern by applying the light exposure to the entire surface or by applying a heat treatment. It is possible to allow metal ions, metal compound or metal colloid to be adsorbed on the ion-exchange groups thus formed. In the case of employing this technology, however, it is necessary to carry out the light exposure operation twice or to apply a heat treatment so as to give rise to the defects that the process step is rendered complex and that the dimensional stability is lowered in the manufactured composite member. What should also be noted is that the surface after the reaction with the fluorine compound is rendered water repellent. Since the plating solution is repelled by the water repellent surface, defective plating tends to be brought about. Particularly, where the substrate is porous, the plating solution is unlikely to permeate inside the porous substrate.

Steps (1) to (5) of the method of manufacturing a composite member according to one embodiment of the present invention do not require troublesome steps such as a resist coating, an etching and the peeling of the resist so as to simplify the manufacturing process, compared with the conventional method of manufacturing a wiring board in which a through-hole is formed by photolithography or a mechanical means. Also, in the case of using a porous material as the insulating substrate, it is also possible to form a conductive pattern within the substrate so as to make it possible to manufacture easily a multi-layered wiring board having micro vias.

It should also be noted that, in the manufacturing method according to one embodiment of the present invention, steps (1) to (5) described above can be continuously carried out on the roll-to-roll basis so as to increase the throughput in the manufacturing step.

It is possible to use any kind of an insulating material for forming the insulating body in which are formed conductive portions such as wirings and vias. To be more specific, the insulating material includes polymers and ceramic materials.

The polymers used as the insulating material include, for example, resins widely used for forming the insulating body of a printed circuit wiring board such as an epoxy resin, a bismaleimide-triazine resin, a PEEK resin, and a butadiene resin. It is also possible to use polyolefins such as polyethylene and polypropylene; polydienes such as polybutadiene, polyisoprene, and polyvinyl ethylene; acrylic resins such as polymethyl acrylate and polymethyl methacrylate; polystyrene derivatives; polyacrylonitrile derivatives such as polyacrylonitrile and polymethacrylonitrile; polyacetals such as polyoxymethylene; polyesters such as polyethylene terephthalate, polybutylene terephthalate and aromatic polyesters; polyarylates; polyamides such as aromatic polyamides including para- and meta-aramid resins and nylon; polyimides; aromatic polyethers such as poly-para-phenylene ether; polyether sulfones; polysulfones; polysulfides; fluorine-containing polymers such as polytetrafluoroethylene; polybenzoxazoles; polybenzothiazoles; polybenzimidazoles; polyphenylenes such as poly-para-phenylene; poly-para-phenylene benzo bis oxazole derivatives; poly-para-phenylene vinylene derivatives; polysiloxane derivatives; novolak resins; melamine resins; urethane resins; and polycarbodiimide resins.

On the other hand, the ceramic materials include, for example, metal oxides such as silica, alumina, titania, and potassium titanate as well as silicon carbide, silicon nitride and aluminum nitride.

Particularly, in the case of forming a conductive portion extending three-dimensionally, i.e., in the case of forming a conductive portion extending not only in the planar direction but also in the thickness direction, it is possible to form easily a conductive portion of a high accuracy by using a porous body formed of an insulating material. The porous body has numerous three-dimensional continuous micropores. Conductive material such as copper can be introduced within the porous body through the continuous micropores. The portion impregnated with copper are conductive and the portion impregnated with resin are insulative. The conductive portion act as a via or a wiring, and the insulative domains act as an insulative layers. The conductive portion formed through a porous sheet become vias, and the conductive portion formed along a porous sheet become wiring. Such a three-dimensional conductive portion can be used as three-dimensional wiring, as multi-layered wiring, or as a via for the interlayer connection in multi-layered wiring.

The photosensitive layer formed in the method of manufacturing a composite member according to one embodiment of the present invention contains a photosensitive group or a photosensitive compound capable of forming an ion-exchange group or of eliminating the ion-exchange group upon irradiation with an energy beam. The photosensitive compound can be used in the form of a photosensitive composition containing a crosslinkable compound. Alternatively, the photosensitive compound can be converted into a polymer, and a crosslinkable group can be introduced into the polymer chain. Such a polymer can be mixed with other components so as to form a photosensitive composition. In the following description, a composition containing such a polymer is called a photosensitive material.

The photosensitive group or the photosensitive compound capable of forming an ion-exchange group or eliminating the ion-exchange group upon irradiation with an energy beam is capable of carrying out a chemical reaction by itself by absorbing the irradiated energy beam so as to form a group or a compound generating an ion-exchange group. Alternatively, it is possible for the particular photosensitive group or the photosensitive compound noted above to be capable of carrying out multi-stage reactions, which is initiated by a chemical reaction caused by the energy beam exposure, so as to generate an ion exchange group. Such a group or a compound carries out first a chemical reaction caused by the energy beam irradiation so as to generate a precursor of the ion-exchange group. Then, the precursor thus generated carries out a chemical reaction with the ambient substance so as to form an ion-exchange group. Further, it is possible for the precursor to act on, for example, an acid generated from the photo acid generating agent by the irradiation with an energy beam so as to form an ion-exchange group.

The photosensitive group or the photosensitive compound absorbing an energy beam so as to form an ion-exchange group by itself includes, for example, o-nitrobenzyl ester derivative of a carboxylic acid, a sulfonic acid, or silanol; p-nitrobenzyl ester sulfonate derivative, naphtyl or phthalimide trifluoro sulfonate derivative. It is also possible to use peroxide esters such as a peroxide of tert-butyl ester of a carboxylic acid as such a photosensitive group or a photosensitive compound. Where a peroxide ester is irradiated with an energy beam, formed is a carboxyl group as the ion-exchange group. Upon irradiation with an energy beam, the peroxide esters form radicals together with ion-exchange groups. As described herein later, the radical thus generated also performs the function of crosslinking the crosslinkable group and, thus, is highly useful.

The materials generating an ion-exchange group by multi-stage reactions initiated by a chemical reaction caused by the energy beam irradiation include, for example, quinone diazides. Upon irradiation with an energy beam, quinone diazides form a ketene intermediate material. Then, the ketene intermediate material thus formed subsequently performs a reaction with water so as to be converted into indene carboxylic acids. The carboxyl group is formed through these steps. The quinone diazides include o-quinone diazide derivatives such as benzoquinone diazide, naphthoquinone diazide and anthraquinone diazide.

The material acting on, for example, an acid generated from a photo acid generating agent upon irradiation with an energy beam so as to form an ion-exchange group includes, for example, a compound having an atomic group formed by introducing a protective group into an ion-exchange group such as a carboxyl group, a phenolic hydroxyl group or a silanol group. In the case of using the particular compound, a photo acid generating agent generating an acid upon irradiation with an energy beam is added to the compound. An acid is generated from the photo acid generating agent by the irradiation with an energy beam, the protective group is decomposed by the acid thus generated so as to form an ion-exchange group. The protective group of the carboxyl group includes, for example, tert-butyl group, tert-butoxy carbonyl group, and acetal groups such as tetrahydropyranyl group. Also, the protective group of phenolic hydroxyl group and silanol group includes, for example, tert-butoxy carbonyl group and is used as tert-butoxy carbonyloxy group.

The photo acid generating agent adapted for de-protection of the protective group includes, for example, salts such as onium salt, diazonium salt, phosphonium salt, and iodonium salt having $CF_3SO_3^-$, p—$CH_3PhSO_3^-$, p—$NO_2PhSO_3^-$, etc., as a paired anion, triazines, organic halogen compounds, 2-nitrobenzyl sulfonic acid esters, imino sulfonates, N-sulfonyloxy imides, aromatic sulfones, and quinone diazide sulfonic acid esters.

To be more specific, the photo acid generating agent includes, for example, triphenyl sulfonium triflate, diphenyl iodonium triflate, 2,3,4,4-tetrahydroxy benzophenone-4-naphthoquinone diazide sulfonate, 4-N-phenyl amino-2-methoxy phenyl diazonium sulfate, diphenyl sulfonyl methane, diphenyl sulfonyl diazo methane, diphenyl disulfone, □-methyl benzoin tosylate, pyrogallol trimesylate, benzoin tosylate, naphthal imidyl trifluoro methane sulfonate, 2-[2-(5-methylfulan-2-yl)ethenyl]-4,6-bis (trichloromethyl)-s-triazine, 2-[2-(fulan-2-yl)ethenyl]-4,6-bis (trichloromethyl)-s-triazine, 2-[2-(4-diethylamino-2-methylphenyl)ethenyl]-4,6-bis (trichloromethyl)-s-triazine, 2-[2-(4-diethyl amino ethyl)amino]-4,6-bis (trichloromethyl)-s-triazine dimethyl sulfate, 2-[2-(3,4-dimethoxy phenyl)ethenyl]-4,6-bis(trichloromethyl)-s-triazine, 2-(4-dimethoxy phenyl)-4,6-bis(trichloromethyl)-s-triazine, 2-methyl-4,6-bis(trichloromethyl)-s-triazine and 2,4,6-tris(trichloromethyl)-s-triazine.

Particularly, it is desirable to use photo acid generating agents generating both an acid and a radical such as an iodonium salt and triazines. In the case of using the photo acid generating agent consisting of the particular compounds together with a crosslinkable compound or a crosslinkable group performing the crosslinking by the radical reaction, it is possible to perform simultaneously the generation of the ion-exchange group by an acid and the crosslinking by the radical so as to improve the sensitivity with a high efficiency.

Where a complex with an acetyl acetonate derivative of aluminum or zirconium is added to the system of generating a silanol group or a phenolic hydroxyl group, the generated silanol group or the phenolic hydroxyl group acts on the complex so as to generate a relatively strong acid. The acid thus generated further generates a silanol group or a phenolic hydroxyl group. Alternatively, the acid crosslinks the crosslinkable group such as an epoxy group.

The photosensitive group or the photosensitive compound capable of eliminating the ion-exchange group upon irradiation with an energy beam represents a group or a compound having an ion-exchange group before irradiation with the energy beam and having the ion-exchange group released therefrom or converted into a hydrophobic group upon irradiation with the energy beam. To be more specific, the particular photosensitive group or photosensitive compound noted above includes, for example, a group or a compound having a carboxyl group subjected to a decarboxylation reaction so as to be decomposed. It is desirable for the group or the compound having a carboxyl group to be a group or a compound in which the decarboxylation reaction tends to be promoted by a basic compound. The particular group or compound includes, for example, a group or a compound having an electron attractive group or an unsaturated bond in the α- or β-position of the carboxyl group. It is desirable for the electron attractive group to be a carboxyl group, a cyano group, a nitro group, aryl group, a carbonyl group or a halogen atom.

The compound having a carboxyl group includes, for example, α-cyano carboxylic acid derivative, α-nitro carboxylic acid derivative, α-phenyl carboxylic acid derivative, β,γ-olefin carboxylic acid derivative, and an indene carboxylic acid derivative. In the case of using a photo base generating agent as a basic compound, a base is generated upon irradiation with an energy beam, and the carboxyl group is decarboxylated by the function of the generated base so as to be eliminated.

The photo base generating agent includes, for example, cobalt amine complex, ketone oxime esters, carbamates such as o-nitrobenzyl carbamates, and formamides. To be more specific, it is possible to use carbamates such as NBC-101 (CAS. No. [119137-03-0]) manufactured by Midori Kagaku K.K. It is also possible to use triaryl sulfonium salts such as TPS-OH (CAS. No. [58621-56-0] manufactured by Midori Kagaku K.K.

It is possible to use a photo acid generating agent and a basic compound in combination in place of the photo base generating compound. In this case, an acid is generated from the photo acid generating agent in the portion irradiated with an energy beam so as to neutralize the basic compound. On the other hand, in the nonirradiated portion, the basic compound acts on the compound having a carboxyl group so as to promote the decarboxylation reaction and, thus, to eliminate the carboxyl group. As a result, it is possible to arrange selectively the carboxyl groups in the irradiated portion alone.

It is possible to add optionally the basic compound as far as the basic compound is neutralized by the acid released from the photo acid generating agent and performs the function of a catalyst for the decarboxylation reaction of the compound having a carboxyl group. The basic compound may be either an organic compound or an inorganic compound. However, it is desirable for the basic compound to be a nitrogen-containing compound. To be more specific, the basic compound includes, for example, ammonia, primary amines, secondary amines and tertiary amines. It is desirable for the photo base generating agent and the basic compound to be contained in the photosensitive composition in an amount of 0.1 to 30% by weight, preferably 0.5 to 15% by weight. Where the content of the photo base generating agent or the basic compound is lower than 0.1% by weight, the decarboxylation reaction fails to proceed sufficiently. On the other hand, if the content noted above exceeds 30% by weight, the deterioration of the compound having a carboxylic group remaining in the unexposed portion tends to be promoted.

Where a photo acid generating agent and a basic compound are used in combination, the amount of the acid that can be generated from the photo acid generating agent should naturally be larger than the amount of base of the basic compound. To be more specific, the amount of the acid that can be generated from the photo acid generating agent should be not smaller than 1 equivalent, preferably not smaller than 1.2 equivalents. Incidentally, the equivalent denotes the amount represented by the formula:

$$E=(U \times V \times W)/(X \times Y)$$

where,

E denotes the equivalent;

U denotes the number of moles of the photo acid generating agent;

V denotes the number of acid molecules generated from one mole of the photo acid generating agent;

W denotes the valency of the generated acid;

X denotes the number of moles of the basic compound; and

Y denotes the valency of the basic compound.

It should be noted that the photosensitive layer is exposed to an alkaline or acidic aqueous solution in the subsequent step of adsorbing the metal ions, the metal compound, or the metal colloid and in the electroless plating step. The photosensitive layer ionized by the ion exchange reaction tends to be dissolved in the aqueous solution and, thus, tends to be peeled from the insulating body forming the substrate. Such being the situation, it is desirable for the group generating or eliminating an ion-exchange group to be supported by or coupled with, for example, a high molecular weight compound such as a polymer in order to prevent the photosensitive layer from being peeled off the substrate. It is most desirable for the group generating an ion-exchange group to be chemically coupled with a high molecular weight compound by a covalent bond.

The polymer or the high molecular weight compound includes, for example, phenolic resins such as phenol novolak resin, xylenol novolak resin, vinyl phenol resin, cresol novolak resin as well as polyimide resin, polyester resin, polyolefin resin, polyacrylic acid ester derivatives and polysiloxane derivatives.

Where the amount of the ion-exchange group introduced into the polymer is excessively small, it is difficult to adsorb sufficiently the metal ions, the metal compound, or the metal colloid. On the other hand, where the ion-exchange group is introduced in an excessively large amount, the ion-exchange group tends to be dissolved in the plating solution and tends to be swollen so as to render the manufactured composite member excessively hygroscopic. It follows that an inconvenience such as a defective insulation tends to take place. Under the circumstances, it is desirable for the group generating or eliminating the ion-exchange group to be introduced into the polymer in an amount falling within a range of between 5% and 300%, more preferably between 30% and 70%. Incidentally, the rate of introduction is represented by the formula:

$$I=M/N \times 100$$

where

I represents the rate of introduction (%);

M represents the number of groups generating or eliminating the ion-exchange group; and N represents the number of monomer units of the polymer.

It is desirable for the ion-exchange group to be a cation-exchangeable group because the ion exchange with the metal ions can be performed easily in the case of the cation-exchangeable group. It is desirable for the cation-exchangeable group to be, for example, a carboxyl group, its salt of —COOX group, a sulfoxyl group, its salt of —SO$_3$X group, a phosphoric acid radical, its salt of —PO$_3$X$_2$ radical, a silanol group, its salt of —SIOX group, a phenolic hydroxyl group, its salt of —ϕ—OX group, where X is selected from the group consisting of a hydrogen atom, an alkali metal, an alkaline earth metal, a typical metal belonging to Groups I or II of the Periodic Table, and an ammonium group, and ϕ is a divalent aromatic ring.

Among the cation-exchangeable groups, it is desirable to use a cation-exchangeable group exhibiting not larger than 7.2 of the pKa value obtained from the ion dissociation constant within water. If the pKa value exceeds 7.2, the adsorption amount per unit area is small in the subsequent step (step 4) of adsorbing the metal ions, the metal compound, or the metal colloid. As a result, it is possible for the electroless plating to fail to be performed sufficiently. It is most desirable to use as the cation-exchangeable group the —COOX group that permits obtaining a sufficient adsorption amount. Incidentally, the —SO$_3$X group also permits obtaining a sufficient adsorption amount. However, it is possible for a strong acid to be generated after manufacture of the composite member so as to corrode the conductive pattern.

In the photosensitive composition according to one embodiment of the present invention, it is desirable for the content of the photosensitive compound to fall within a range of between 5% by weight and 95% by weight, more desirably between 20% by weight and 80% by weight. Where the content of the photosensitive compound is excessively low, the amount of the ion-exchange group is not sufficiently large so as to make it difficult to achieve satisfactory plating. On the other hand, if the content of the photosensitive compound is excessively large, the photosensitive compound is dissolved in the plating solution or is swollen. In addition, the manufactured composite member is rendered hygroscopic so as to bring about an insulation breakdown.

In addition to the photosensitive compound, the photosensitive composition according to one embodiment of the present invention also contains a crosslinkable compound or a crosslinkable group as an indispensable component.

Used in one embodiment of the present invention is a crosslinkable compound or a crosslinkable group, which can be crosslinked three-dimensionally by the irradiation with an energy beam or by the heating so as to be polymerized. If the crosslinkable compound or the crosslinkable group is crosslinked and polymerized, the photosensitive composition layer is enabled to exhibit an improved resistance to, for example, the plating solution. As a result, it is possible to increase the content of the ion-exchange group in the photosensitive composition layer, thereby achieving satisfactory plating. It is possible for the crosslinkable compound or the crosslinkable group to be self-polymerized and crosslinked or to be coupled with another substance contained in the photosensitive composition layer so as to be crosslinked.

The crosslinkable groups capable of self-polymerization include, for example, a vinyl group, an acryloyl group, a methacryloyl group, an epoxy group such as a glycidyl group, a vinyl ether group, chloromethyl phenyl group, an alkoxy silyl group, a benzocyclobutene group, a maleimidyl group and derivative groups thereof. On the other hand, the crosslinkable compound includes a compound having the crosslinkable groups noted above introduced to the backbone chain, the side chain or the terminal of a polymer. The compound having the crosslinkable group introduced therein need not be a polymer. However, a polymer having a high molecular weight even before the crosslinking is allowed to have a still higher molecular weight by the crosslinking, which is effective for improving the resistance to the solvent.

The molecular weight of the polymer is not particularly limited. However, it is desirable for the polymer to have a weight average molecular weight of 500 to 5,000,000, more desirably to have a weight average molecular weight of 1,500 to 50,000. Where the molecular weight of the polymer is excessively low, the polymer is low in its film forming capability, and the resistance to the solvent such as the resistance to the plating solution tends to be lowered. On the other hand, if the molecular weight of the polymer is excessively high, the dissolving capability of the polymer in a solvent for the coating is lowered so as to render the coating properties poor.

The crosslinkable group in the case where the crosslinkable group is coupled with another substance contained in the photosensitive composition layer so as to achieve the crosslinking includes, for example, a hydroxyl group and an amino group. On the other hand, the crosslinkable compound having the particular crosslinkable group includes a compound having the particular crosslinkable group introduced into the backbone chain, the side chain or the terminal of a polymer. In the case of using the particular crosslinkable compound, used is a crosslinking assistant having a plurality of atomic groups capable of coupling with the hydroxyl group or the amino group so as to permit the atomic groups to be coupled with the hydroxyl group or the amino group so as to form a crosslinked coupling. The crosslinking assistant includes, for example, alkoxy silanes, aluminum alkoxides, carboxylic anhydrides, bismaleimide derivatives, isocyanate compounds, polyhydric methylol compounds and epoxy compounds.

It is possible to use as the crosslinkable group the atomic groups capable of dimerization upon irradiation with an energy beam. The particular atomic groups are advantageous in that the irradiated portion alone can be selectively crosslinked. However, the atomic groups noted above absorb partly the energy beam. The particular atomic groups include, for example, a cinnamoyl group, a cinnamilidene group, a chalcon residue, an isocumarine residue, 2.5-dimethoxy stilben residue, a styryl pyrimidium residue, a thymine residue, an □-phenyl maleimidyl group, an anthracene residue and a 2-pyron residue.

The polymer having the crosslinkable group introduced therein includes, for example, phenolic resins such as phenol novolak resin, xylenol novolak resin, vinyl phenol resin, cresol novolak resin, as well as polyamide derivatives, polyimide derivatives, polyester derivatives, polyether derivatives, polyacrylic acid ester derivatives, and polysiloxane derivatives. Where the amount of the crosslinkable groups introduced into the polymer is excessively small, the crosslinking does not proceed sufficiently, with the result that the polymer tends to be dissolved in the plating solution and tends to be swollen. On the other hand, where the crosslinkable groups are excessively introduced into the polymer, the photosensitive composition layer tends to be cured and shrunk in the crosslinking step, with the result that the substrate tends to be deformed or the photosensitive composition layer tends to be peeled from the substrate. It is desirable for the amount of the crosslinkable group introduced into the polymer to fall within a range of between 1% by weight and 300% by weight, more desirably, between 20% by weight and 200% by weight. Incidentally, the rate of introduction of the crosslinkable group is denoted by:

$$R = O/P \times 100$$

where

R represents the rate of introduction of the crosslinkable group into the polymer;

O represents the number of crosslinkable groups; and

P represents the number of monomer units of the polymer.

It is possible to use as the crosslinkable compound or the crosslinkable group a material that reacts with the ion-exchange group so as to achieve coupling between the ion-exchange groups. For example, in a crosslinking agent having a plurality of hydroxyl groups, different carboxyl groups can be bonded to each other by an ester bond so as to achieve the crosslinking. However, such a crosslinkable compound decreases the amount of the ion-exchange groups generated by the light exposure in the preceding step, resulting in failure to achieve sufficient plating. In order to avoid such an inconvenience, it is desirable to use a material that can be crosslinked without utilizing an intervening ion-exchange group.

The crosslinkable compounds other than polymers are compounds having the crosslinkable groups described above. It is desirable for the crosslinkable compound other than the polymer to have a plurality of crosslinkable groups. To be more specific, the crosslinkable compounds other than polymers, which can be used in the present invention, include, for example:

(1) A compound having, for example, an acryloyl group, a methacryloyl group, a vinyl group or an allyl group introduced into a polyhydric alcohol, as shown in chemical formula (1) given below:

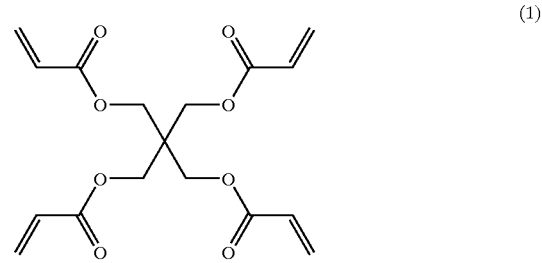

(2) Epoxy acrylates as shown in chemical formula (2) given below:

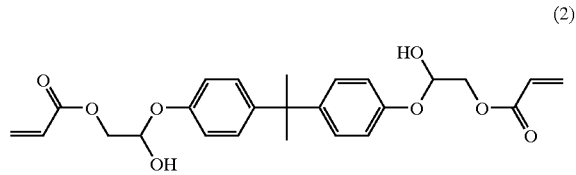

(3) Triazine derivatives introduced vinyl group etc. as shown in chemical formula (3) given below:

(3)

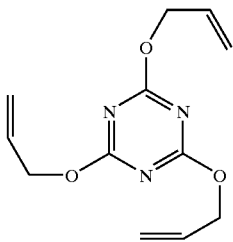

It is possible for the crosslinkable group to be a siloxane cluster derivative group such as POSS (Polyhedral Oligomeric Silsesquioxane: polysiloxane $T_8$ steric body). Desirable examples of the polymer having the crosslinkable group introduced therein are those obtained by polymerizing monomers such as methacrylate $T_8$ steric body shown in chemical formula (4) given below and styryl $T_8$ steric body shown in chemical formula (5) given below:

(4)

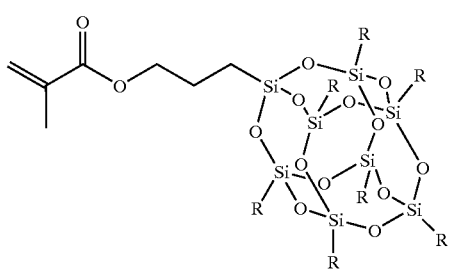

methacrylate $T_8$ steric body (5)

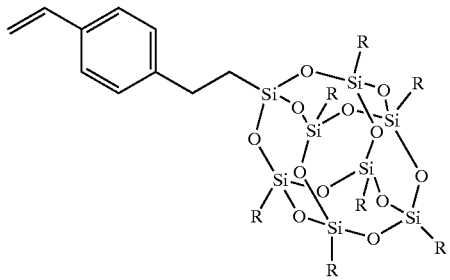

styryl $T_8$ steric body where R represents H, a substituted or unsubstituted alkyl group, aryl group, or aralkyl group, e.g., methyl group, ethyl group, butyl group, isopropyl group, cyclopentyl group, cyclohexyl group or phenyl group.

Further, it is possible to use as the crosslinkable compound a polymer having an unsaturated bond such as a carbon-to-carbon double bond or a carbon-to-carbon triple bond introduced into the backbone chain of the polymer. Examples of a polymer having an unsaturated bond introduced therein include a polymer obtained by polymerizing diene monomers such as butadiene and cyclohexadiene and a monomer such as a norbornene derivative. In view of the resistance to heat, it is desirable to use a polymer obtained by polymerizing a cyclohexadiene derivative or a norbornene derivative. The specific cyclohexadiene derivatives include, for example, cyclohexadiene and an esterified material of 5,6-dihydroxy-2-cyclohexene-1,4-ylene such as cis-5,6-bis(pivaroyloxy)-2-cyclohexene-1,4-ylene. The unsaturated bond introduced into the backbone chain of the polymer is inferior to the crosslinkable group described above in terms of the reactivity. However, the polymer having the unsaturated bond introduced into the backbone chain can be manufactured easily. Also, since the polymer backbone chain is crosslinked directly, the polymer after the crosslinking treatment is excellent in its resistance to heat and its mechanical properties. It is possible to introduce such an unsaturated bond into the backbone chain of the polymer having a photosensitive group introduced therein. For the crosslinking of the carbon-to-carbon double bonds and the carbon-to-carbon triple bonds, it is desirable to add a radical generating agent. A polyfunctional radical generating agent having a plurality of radical generating groups in a single molecule exhibits a high crosslinking effect and, thus, is excellent. The polyfunctional radical generating agents include, for example, 2,2-bis(4,4-di-tert-butyl peroxy cyclohexyl)propane, and 3,3',4,4'-tetra(t-butyl peroxy carbonyl)benzophenone.

It is most desirable for the crosslinking reaction to proceed on the basis of the radical reaction. For example, in the nucleophilic substitution reaction and the electrophilic substitution reaction such as a cation polymerization and anion polymerization, the reactant or the reaction intermediate product exhibit in many cases an ion exchange capability. It follows that it is possible for the adsorption of the metal ions, the metal compound, or the metal colloid to take place; unexpected positions.

In the radical reaction, however, it is possible for the crosslinking reaction to proceed in spite of nonuse of such an ion-exchangeable reactant or intermediate product. Also, since the reaction proceeds promptly even under room temperature, the heat treatment is unnecessary in general. It follows that it is possible to prevent the dimensional stability from being lowered and to prevent the thermal deterioration accompanying the heat treatment of the insulating body forming the substrate. It should also be noted that the bond of the crosslinked portion formed by the nucleophilic reaction or the electrophilic reaction tends to be decomposed by a strong acid or alkali. In general, the plating solution is a strong alkali in many cases and, thus, the crosslinked portion tends to be dissolved in the plating solution. On the other hand, the bond formed by the radical reaction is unlikely to be affected by a strong acid or a strong alkali. It follows that the crosslinking performed by the radical reaction is highly effective as a crosslinking means. For example, the crosslinking performed by the radical reaction permits preventing the thermal deterioration of the substrate, improves the selectivity in the adsorption step, and increases the resistance to the plating solution.

It is desirable for the content of the crosslinkable compound in the photosensitive composition to fall within a range of between 1% by weight and 50% by weight, more desirably between 10% by weight and 30% by weight. If the content of the crosslinkable compound is excessively low, it is impossible to achieve sufficient crosslinking, resulting in failure to ensure sufficiently the resistance to the solvent such as the resistance to the plating solution. On the other hand, if the content of the crosslinkable compound is excessively high, the photosensitive composition tends to be cured and shrunk so as to deform the substrate.

According to one embodiment of the present invention, it is possible for the photosensitive group and the crosslinkable group to be present independently in different compounds. However, it is desirable for a polymer to have both the photosensitive group and the crosslinkable group. Where a photosensitive compound having a photosensitive group is mixed with a crosslinkable compound having a crosslinkable group, it is possible for the photosensitive compound to fail are to be fixed sufficiently even if molecules of the crosslinkable compound are polymerized. On the other hand, when it comes to a polymer having both a photosensitive group and a crosslinkable group, the crosslinking reaction of the crosslinkable group can be effectively utilized for the fixation of all the photosensitive groups, leading to excellent efficiency.

When it comes to a polymer having both a photosensitive group and a crosslinkable group, it is desirable for the crosslinkable group to be capable of carrying out the radical polymerization by the reasons described previously. The crosslinkable group capable of the radical polymerization includes, for example, a vinyl group, an acryloyl group, a maleimidyl group and derivative groups thereof. These crosslinkable groups can be synthesized easily and exhibit a high efficiency of the crosslinking reaction. To be more specific, the crosslinkable group capable of the radical polymerization includes, for example, a vinyl group, an allyl group, a vinyl dimethyl silyl group, an acryloyl group, a methacryloyl group and a maleimidyl group. It is required for the polymer chain having a photosensitive group and a crosslinkable group introduced therein simultaneously to be good in coating properties of a solution, to be excellent in resistance to acid and alkali, to be high in bonding strength to the substrate, and to be excellent in resistance to heat. The amount of the adsorbed plating catalyst can be increased using the crosslinkable photosensitive polymer because the catalyst solution can diffuse across the photosensitive layer. Such being the situation, the desirable polymer chains include, for example, a novolak resin and its derivative, a polyacrylic acid ester and its derivative, a polystyrene derivative, a copolymer between a styrene derivative and a maleimide derivative, polynorbornene and its derivative, polycyclohexene and its derivative, polycyclohexane and its derivative, polyphenylene and its derivative, silicone resin, polyamides, polyimides and polyacrylates.

Particularly, it is desirable to use novolak resins such as phenol novolak and cresol novolak, a silicone resin, and copolymers synthesized by using as the raw materials a monomer group A into which a photosensitive group and a crosslinkable group can be introduced easily and a monomer group B for improving the solubility of the polymer chain and the resistance to heat. The monomer group A is a raw material before introduction of the photosensitive group and the crosslinkable group. It is possible to introduce the photosensitive group and the crosslinkable group into the monomer group A by a known technology. It is possible to synthesize the copolymer by using the monomers selected from the monomer group A. However, it is possible to improve the characteristics of the copolymer by suitably adding the monomer of the monomer group B.

The monomer group A includes, for example, 4-hydroxy styrene and maleic anhydride. On the other hand, the monomer group B includes, for example, a silylated styrene derivative such as p-pentamethyl disilyl styrene, a maleimide derivative such as phenyl maleimide, and norbornene.

It is desirable for the amount of the photosensitive group introduced into the polymer to fall within a range of between 5% and 300%, more desirably between 30% and 70%. On the other hand, it is desirable for the amount of the crosslinkable group introduced into the polymer to fall within a range of between 1% and 300%, more desirably between 20% and 200%. Incidentally, the rate of introduction is determined by the formula given below:

$$K=J/L$$

where

K represents the rate of introduction;
J represents the number of the photosensitive group or the crosslinkable group; and
L represents the number of monomer units of the polymer.

Where the amount of the photosensitive group introduced into the polymer is excessively small, it is difficult to allow the metal ions, the metal compound, or the metal colloid to be adsorbed sufficiently. On the other hand, where the amount noted above is excessively large, the photosensitive composition layer tends to be dissolved in the plating solution and tends to be swollen. In addition, the manufactured composite member tends to absorb moisture easily so as to bring about an inconvenience such as defective insulation. Where the amount of the crosslinkable group introduced into the polymer is excessively small, it is difficult to achieve the crosslinking sufficiently, with the result that the photosensitive composition layer tends to be dissolved easily in the plating solution and tends to be swollen. On the other hand, where the crosslinkable group is introduced excessively into the polymer, the photosensitive layer is cured and shrunk in the crosslinking step, with the result that the substrate is deformed or the photosensitive layer tends to peel from the substrate.

The molecular weight of the polymer having the photosensitive group and the crosslinkable group introduced therein is not particularly limited. However, it is desirable for the polymer to have a weight average molecular weight falling within a range of between 500 and 5,000,000, more desirably between 1,500 and 50,000. Where the molecular weight of the polymer is excessively low, the polymer is poor in its film forming capability, with the result that the resistance to the solvent such as the resistance to the plating solution tends to be lowered. On the other hand, where the molecular weight is excessively high, the solubility in the solvent for the coating is lowered. In addition, the coating properties are rendered poor.

In order to activate the crosslinkable compound or the crosslinkable group for allowing the crosslinking reaction to proceed, a heat treatment or energy beam irradiation is applied. For example, a vinyl group, an acryloyl group, a methacryloyl group, a maleimide group, etc. are allowed to perform the crosslinking reaction by simply applying energy beam irradiation or heating without using a catalyst or the like. Further, it is possible to further promote the crosslinking reaction by adding a catalyst such as a radical generating agent. Still further, it is possible to cure, for example, an epoxy group, a vinyl ether group, an alkoxy silyl group, an acetoxy silyl group, an etoxy silyl group and an oxime silyl group by an acidic catalyst or a basic catalyst.

It is desirable for these crosslinking reactions to have a potentiality that the reaction is caused to proceed by the treatment such as energy beam irradiation or heating because the photosensitive composition layer is formed in general by coating a substrate with a solution or the like of a photosensitive composition. If the crosslinking reaction proceeds within the solution, the solution is gelled so as to make it impossible to carry out the coating. In order to avoid such an inconvenience, it is desirable for the crosslinking reaction to have a potentiality such that the crosslinking reaction is caused to proceed by the activation applied after the coating. It is possible to impart a potentiality to the crosslinking reaction by adding a potential catalyst. In this case, a potential catalyst is activated after formation of a photosensitive composition layer so as to crosslink the crosslinkable group.

It is desirable for the potential catalyst used to be activated by energy beam irradiation or the heating. For example, it is possible to use a radical generating agent as a potential catalyst that is activated by the heat or the energy beam irradiation. Also, a photo acid generating agent and a photo base generating agent perform the function of a potential catalyst that is activated by the energy beam irradiation. As already described, it is most desirable for the crosslinking reaction to be a radical reaction. To be more specific, it is desirable to use a radical generating agent in combination with a crosslinkable compound or a crosslinkable group capable of the radical polymerization.

It is possible to use organic peroxides as the radical generating agent. The organic peroxides include, for example, ketone peroxides such as methyl ethyl ketone peroxide, cyclohexanone peroxide, methyl cyclohexanone peroxide, methyl acetoacetate peroxide, and acetyl acetone peroxide; peroxy ketals such as 1,1-bis(t-hexyl peroxy)-3,3,5-trimethyl cyclohexane, 1,1-bis(t-hexyl peroxy)cyclohexane, 1,1-bis(t-butyl peroxy)-3,3,5-trimethyl cyclohexane, di-t-butyl peroxy-2-methyl cyclohexane, 1,1-bis(t-butyl peroxy)cyclohexane, 1,1-bis(t-butyl peroxy)cyclodecane, 2,2-bis(t-butyl peroxy)butane, n-butyl-4,4-bis(t-butyl peroxy)valerate, and 2,2-bis(4,4-di-t-butyl peroxy cyclohexyl)propane; hydroperoxides such as p-menthane hydroperoxide, diisopropyl benzene hydroperoxide, 1,1,3,3-tetramethyl butyl hydroperoxide, cumene hydroperoxide, t-hexyl hydroperoxide, and t-butyl hydroperoxide; dialkyl peroxides such as □,□'-bis(t-butyl peroxy)diisopropyl benzene, dicumyl peroxide, 2,5-dimethyl-2,5-bis(t-butyl peroxy)hexane, t-butyl cumyl peroxide, di-t-butyl peroxide, and 2,5-dimethyl-2,5-bis(t-butyl peroxy)hexene; diacyl peroxides such as isobutyryl peroxide, 3,5,5-trimethyl hexanoyl peroxide, octanoyl peroxide, lauroyl peroxide, stearoyl peroxide, succinic acid peroxide, m-toluoyland benzoyl peroxide, and benzoyl peroxide; peroxy carbonates such as di-n-propyl peroxy carbonate, diisopropyl peroxy dicarbonate, bis(4-t-butyl cyclohexyl) peroxy dicarbonate, di-2-ethoxy ethyl peroxy dicarbonate, di-2-ethyl hexyl peroxy dicarbonate, di-3-methoxy butyl peroxy dicarbonate, and di(3-methyl-3-methoxy butyl)peroxy dicarbonate; peroxy esters such as □,□'-bis(neodecanoyl peroxy) diisopropyl benzene, cumyl peroxy neodecanoate, 1,1,3,3-tetramethyl butyl peroxy neodecanoate, 1-cyclohexyl-1-methyl ethyl peroxy neodecanoate, t-hexyl peroxy neodecanoate, t-butyl peroxy neodecanoate, t-hexyl peroxy pivalate, t-butyl peroxy pivalate, 1,1,3,3-tetramethyl butyl peroxy-2-ethyl hexanoate, 2,5-dimethyl-2,5-bis(2-ethyl hexanoyl peroxy)hexane, 1-cyclohexyl-1-methyl ethyl peroxy-2-ethyl hexanoate, t-hexyl peroxy-2-ethyl hexanoate, t-butyl peroxy-2-ethyl hexanoate, t-butyl peroxy isobutyrate, t-hexyl peroxy isopropyl monocarbonate, t-butyl peroxy meleic acid, t-butyl peroxy 3,5,5-trimethyl hexanoate, t-butyl peroxy laurate, 2,5-dimethyl-2,5-bis(m-toluyl peroxy)hexane, t-butyl peroxy isopropyl monocarbonate, t-butyl peroxy 2-ethyl hexyl monocarbonate, t-hexyl peroxy benzoate, 2,5-dimethyl-2,5-bis(benzoyl peroxy)hexane, t-butyl peroxy acetate, t-butyl peroxy-m-toluyl benzonate, t-butyl peroxy benzoate, and bis(t-butyl peroxy)isophthalate; as well as t-butyl peroxy allyl monocarbonate, t-butyl trimethyl peroxide, 3,3',4,4'-tetrakis(t-butyl peroxy carbonyl)benzophenone and 2,3-dimethyl-2,3-diphenyl butane. Particularly, the polyfunctional radical generating agents such as 2,2-bis(4,4-di-t-butyl peroxy cyclohexyl)propane and 3,3'4,4'tetra(t-butyl peroxy carbonyl)benzophenone also perform the function of a crosslinking agent and, thus, are used desirably. In addition to the peroxides, it is also possible to use azonitriles such as azobisisobutyronitrile.

However, a problem remains unsolved in the method of activating the crosslinkable compound or the crosslinkable group having a potentiality by energy beam irradiation or heating. Specifically, where the activation is performed by energy beam irradiation, it is possible for the photosensitive compound or the photosensitive group to be sensitized without any order. It is also possible for the light beam used for the light exposure for sensitizing the photosensitive compound or the photosensitive group to be absorbed by the crosslinkable compound, the crosslinkable group or the potential catalyst such as a radical generating agent so as to lower the light exposure sensitivity. Also, when heated, it is possible for the substrate to be thermally deteriorated or thermally shrunk so as to lower the dimensional stability of the pattern.

In order to overcome these problems, it is desirable to use a photosensitive compound or a photosensitive group that can be activated by the optical reaction so as to generate or eliminate an ion-exchange group and, at the same time, to activate the crosslinking reaction. It is possible to achieve simultaneously the generation or elimination of an ion-exchange group and the crosslinking reaction by using a photo acid generating agent of the radical generation type. Alternatively, it is also possible to achieve simultaneously the generation or elimination of an ion-exchange group and the crosslinking reaction by using peroxide esters.

The photo acid generating agent generating an acid upon irradiation with an energy beam includes a photo acid generating agent of a radical generation type that generates a radical simultaneously with the acid generation. In the case of using the particular photo acid generating agent, an atomic group having a protective group introduced into an ion-exchange group and a crosslinkable group capable of a radical polymerization in combination, it is possible for the irradiated portion to be crosslinked by the radical and, at the same time, it is possible for an ion-exchange group to be generated by the acid so as to achieve the plating.

The photo acid generating agent that permits the particular function described above includes, for example, triazines. The triazines include, for example, 2-[2-(5-methyl furan-2-yl)ethenyl-4,6-bis (trichloromethyl)-s-triazine, 2-[2-(furan-2-yl)ethenyl]-4,6-bis (trichloromethyl)-s-triazine, 2-[2-(4-diethyl amino-2-methyl phenyl)ethenyl]4,6-bis (trichloromethyl)-s-triazine, 2-[2-(4-diethyl amino ethyl) amino]-4,6-bis(trichloromethyl)-s-triazine.dimethyl sulfate, 2-[2-(3,4-dimethoxy phenyl)ethenyl]-4,6-bis (trichloromethyl)-s-triazine, 2-(4-dimethoxy phenyl)-4,6-bis (trichloromethyl)-s-triazine, 2-methyl-4,6-bis (trichloromethyl)-s-triazine and 2,4,6-tris(trichloromethyl)-s-triazine.

Also, peroxy esters, i.e., peroxide esters, are capable of generating a carboxyl group of the ion-exchange group and, at the same time a radical upon irradiation with an energy beam. The radical thus generated serves to crosslink the crosslinkable compound such as a vinyl compound. Since the generation of the carboxyl group and the crosslinking are caused by a single optical reaction, the photosensitivity is not lowered by the light absorption of the crosslinkable compound. Further, since the heat treatment is not required, the thermal deterioration and the thermal shrinkage do not take place.

It is possible to use a polymer having peroxide esters introduced into the side chain as the peroxide esters. It is also possible to use polyfunctional peroxide esters having a relatively low molecular weight. Since the polyfunctional peroxide esters having a low molecular weight are changed into polyfunctional carboxylic acids, the particular polyfunctional peroxide esters were considered to elute into an alkaline electroless plating solution. However, the present inventors have found for the first time that, if a polymer capable of a radical polymerization such as polyvinyl ethylene is added, the polyfunctional peroxide esters do not elute into the alkaline electroless plating solution so as to achieve a satisfactory plating.

The reason for the capability of achieving a satisfactory plating is considered to be as follows. Specifically, the peroxide ester is sensitized to light so as to generate a carboxy radical, and the carboxy radical thus generated reacts and is coupled with a polymer so as to achieve a satisfactory plating. The polyfunctional peroxide esters of a low molecular weight are also coupled with a polymer after the light sensitization so as to be introduced into the side chain of the polymer, with the result that the elution into the plating solution is prevented. According to one embodiment of the present invention, it is possible to prepare a photosensitive composition by simply mixing a polyfunctional peroxide ester with a crosslinkable polymer having a radical reactivity. The peroxide ester group coupled with a polymer does not perform the function of an ion-exchange group. It follows that it is necessary for at least two peroxide ester groups, which are coupled with a polymer and form ion-exchange groups, to be present in a single molecule. It is necessary to synthesize the polymer having a peroxide ester introduced into the side chain every time the rate of introduction of the peroxide ester is changed. On the other hand, in the case of using polyfunctional peroxide esters having a low molecular weight, it is possible to adjust the amount of the ion-exchange group generated in the sensitizing step by simply changing the mixing ratio of the polyfunctional peroxide esters. Since it is necessary to adjust delicately the amount of the ion-exchange groups depending on the composition of the plating solution and the plating conditions, the capability of changing the amount of the ion-exchange groups by simply changing the mixing ratio is highly advantageous.

The peroxy esters include, for example, peroxides of 1-cyclohexyl-1-methyl ester, tert-butyl ester, tert-hexyl ester and 1,1,3,3-tetramethyl butyl ester of a carboxylic acid. Particularly, it is desirable to use a peroxide of tert-butyl ester in view of, for example, the storage stability. The specific polyfunctional peroxide esters include, for example, bis(tert-butyl peroxy)isophthalate (trade name of Perbutyl IF manufactured by Nippon Yushi K.K.) and 3,3',4,4'-tetra-(tert-butyl peroxy carbonyl)benzophenone (trade name of BTTB manufactured by Nippon Yushi K.K.). Particularly, 3,3',4,4'-tetra-(tert-butyl peroxy carbonyl)benzophenone, which can be stored under room temperature, is excellent in the storage stability and can be sensitized by various photosensitizers as described herein later.

It is also possible to use tert-butyl peroxy allyl monocarbonate (trade name of Pellomer AC manufactured by Nippon Yushi K.K.) having a peroxide ester group and a radical polymerizable group in a molecular, though this compound has a low molecular weight. In this case, the radical polymerizable group is polymerized so as to form a polymer and, thus, it is possible to prevent the elution into a plating solution.

It is also possible to use, for example, a silyl peroxide such as tert-butyl silyl peroxide as a chemical structure capable of generating an ion-exchange group and a radical simultaneously. Silyl peroxide generates a silanol group as an ion-exchange group.

The compound capable of generating an ion-exchange group and a radical simultaneously can also be used as a radical generating agent for crosslinking a photosensitive compound and a crosslinkable compound. Since an ion-exchange group is generated simultaneously with the radical generation, the mixing of the particular compound permits efficiently achieving a high sensitivity. In this case, it is desirable for the ion-exchange group generated from the photosensitive compound and the ion-exchange group generated from the radical generating agent to have the ion exchange capabilities substantially equal to each other. For example, it is desirable to use quinone diazides or o-nitrobenzyl esters of a carboxylic acid in combination with peroxide esters of a carboxylic acid. Each of these compounds generates a carboxylic acid upon irradiation with an energy beam. Alternatively, it is also possible to use o-nitrobenzyl esters of a silanol and silyl peroxide in combination. It should be noted, however, that the carboxyl group is superior to the silanol group in the adsorption capability of the catalyst nucleus. Also, in the case of using a silica glass substrate, the silanol group is not adapted for use as the ion-exchange group because a silanol group is present on the surface of the substrate.

As described above, it is desirable for the photosensitive material used in the method according to one embodiment of the present invention for manufacturing a composite member having a conductive pattern to be formed of a photosensitive composition containing a polymer having a photosensitive group for generating or eliminating an ion-exchange group and a crosslinkable group capable of a radical polymerization and a radical generating agent. It is desirable for the radical generating agent to be capable of generating an acid or an ion-exchange group. The radical generating agent generating an acid includes triazines as typical examples, and the radical generating agent generating an ion-exchange group includes peroxide esters as typical examples.

It is desirable for the photosensitive group used in combination with the radical generating agent generating an acid to be an atomic group having an ion-exchange group protected with a protective group. The protective group that can be de-protected with an acid is used. Particularly, it is desirable to use a carboxylic group, a phenolic hydroxyl group and a silanol group each having a tert-butyl group or a tetrahydropyranyl group as a protective group. It is particularly desirable to use a quinone diazide derivative group or an o-nitrobenzyl ester derivative group as a photosensitive group used in combination with a radical generating agent generating an ion-exchange group.

A desirable combination of the photosensitive composition includes a polymer and triazines used as a radical generating agent. In the polymer used in the photosensitive composition of one embodiment of the present invention, a photosensitive group selected from the group consisting of tert-butoxy carbonyl methyl group, tert-butoxy carbonyl ethyl group, tetrahydro pyranyloxy carbonyl methyl group, and tetrahydro pyranyloxy carbonyl ethyl group is introduced into the phenolic hydroxyl group of a phenol novolak resin or a cresol novolak resin. Also, a crosslinkable group selected from the group consisting of acryloyl group and methacryloyl group is introduced into the polymer.

It is also desirable to use a combination of a polymer and peroxide esters of a carboxylic acid such as 3,3',4,4'-tetra-(tert-butyl peroxy carbonyl)benzophenone used as a radical generating agent. In the polymer contained in the photosensitive composition used in one embodiment of the present invention, a photosensitive group selected from the group consisting of naphthoquinone-1,2-diazide-4 sulfonic acid ester, o-nitrobenzyloxy carbonyl methyl group or o-nitrobenzyloxy carbonyl ethyl group is introduced into the phenolic hydroxyl group of a phenolic novolak resin or a cresol novolak resin. A crosslinkable group selected from the group consisting of an acryloyl group and a methacryloyl group is also introduced into the polymer.

It is possible to add various photosensitizers to the photosensitive composition or the photosensitive material used in the manufacturing method according to one embodiment of the present invention. It is possible to improve the sensitivity and to change in various fashions the photosensitive wavelength in accordance with the light source used by adding a photosensitizer. Where it is intended to achieve the sensitization deep inside a porous substrate, it is desirable to sensitize the photosensitive composition or the photosensitive material with an energy beam that is readily transmitted through the substrate such as a light beam having a wavelength other than the absorption wavelength of the substrate. When it comes to a porous substrate such as a polyimide substrate, light having a wavelength not longer than about 500 nm is absorbed by the substrate, making it difficult to expose the inner region of the porous substrate to light by using, for example, a g-line or an i-line. Even in this case, it is possible to achieve the sensitization to reach the inner region of the porous substrate by using a visible light photosensitizer having an absorption band in the wavelength region not shorter than 500 nm.

The photosensitizers include, for example, an aromatic hydrocarbon and a derivative thereof, a benzophenone and a derivative thereof, o-benzoyl benzoic acid ester and a derivative thereof, acetophenone and a derivative thereof, benzoin and a derivative thereof, benzoin ether and a derivative thereof, xanthone and a derivative thereof, thioxanthone and a derivative thereof, a disulfide compound, a quinone-based compound, a compound having a halogenated hydrocarbon, amines, melocyanine-based coloring matters such as 3-ethyl-5-[(3-ethyl-2(3H)-benzothiazolylidene) ethylidene]-2-thioxo-4-oxazolidinone and 5-[(1,3-dihydro-1,3,3-trimethyl-2H-indole-2-ylidene)ethylidene]-3-ethyl-2-thioxo-4-oxazolidinone; cyanine-based coloring matters such as 3-butyl-1,1-dimethyl-2-[2[2-diphenyl amino-3-[( 3-butyl-1,3-dihydro-1,1-dimethyl-2H-benz[I]indole-2-ylidene) ethylidene-1-cyclopentene-1-yl]ethenyl]-1H-benz [I]indolium percholate, 2-[2-[2-chloro-3-[(3-ethyl-1,3-dihydro-1,1-dimethyl-2H-benz[I]indole-2-ylidene) ethylidene]-1-cyclohexane-1-yl]ethenyl]-1,1-dimethyl-3-ethyl-1H-benz[e]indolium tetrafluoroborate, and 2-[2-[2-chloro-3-[(3-ethyl-1,3-dihydro-1,1-dimethyl-2H-benz[e] indole-2-ylidene)ethylidene]-1-cyclopentene-1-yl]ethenyl]-1,1-dimethyl-3-ethyl-1H-benz[e]indolium iodide; squalium series cyanine-based coloring matters; styryl-based coloring matters such as 2-[p-(dimethyl amino)styryl]benzothiazole, 2-[p-(dimethyl amino)styryl]naphtho[1,2-d]thiazole and 2-[(m-hydroxy-p-methoxy)styryl]benzothiazole; xanthene coloring matters such as eosine B (C.I. No. 45400), eosine J (C.I. No. 45380), cyanosine (C.I. No. 45410), Bengal rose, erythrosine (C.I. No. 45430), 2,3,7-trihydroxy-9-phenyl xanthene-6-one, and Rhodamine 6G; thiazine coloring matters such as thionine (C.I. No. 52000), azule A (C.I. No. 52005) and azule C (C.I. No. 52002); pyronine coloring matters such as pyronine B (C.I. No. 45005) and pyronine GY (C.I. No. 45005); cumarin-based coloring matters such as 3-acetyl cumarin, 3-acetyl-7-diethyl amino cumarin, 3-(2-benzothiazolyl)-7-(diethyl amino)cumarin, 3-(2-benzothiazolyl)-7-(dibutyl amino)cumarin, 3-(2-benzimidazolyl)-7-(diethyl amino)cumarin, 10-(2-benzothiazolyl)-2,3,6,7-tetrahydro-1,1,7,7-tetramethyl-1H, 5H,1H-[1]benzopyrano[6,7,8-ij]quinolidine-11-one, 3-(2-(benzothiazolyl)-7-(dioctyl amino)cumarin, 3-carbetoxy-7-(diethyl amino)cumarin, 10-[3-[4-(dimethyl amino)phenyl]-1-oxo-2-propenyl]-2,3,6,7-tetrahydro-1,1,7,7-tetramethyl-1H,5H,11H-[1]benzopyrano[6,7,8-ij]quinolidine-11-one; keto cumarin-based coloring matters such as 3,3'-carbonyl bis(7-diethylamino cumarin), 3,3'-carbonyl-7-diethylamino cumarin-7'-bis(butoxy ethyl)amino cumarin and 3,3'-carbonyl bis(7-dibutyl amino cumarin); and DMC-based coloring matters such as 4-(dicyano methylene)-2-methyl-6-(p-dimethyl amino styryl)-4H-pyran and 4-(dicyano methylene)-2-methyl-6-(p-dibutyl amino styryl)-4H-pyran.

The mixing amount of the photosensitizer should fall within a range of generally between 0.001% by weight and 10% by weight, preferably between 0.01% by weight and 5% by weight, based on the amount of the compound generating or eliminating the ion-exchange group upon exposure to light.

In the method according to one embodiment of the present invention, a pattern of ion-exchange groups is formed by selectively exposing a photosensitive layer comprising the components described above to light in a pattern. Then, the crosslinkable groups in the exposed portion are crosslinked. The energy beam for activating the photosensitive compound, the photosensitive group, the crosslinkable compound and the crosslinkable group is not particularly limited. It is possible to use, for example, light rays such as ultraviolet light rays, visible light rays, and infrared light rays as well as X-rays, electron beams, □-rays, □-rays and baryon rays as the energy beam. In general, ultraviolet light, visible light and electron beam are most widely used as the energy beam. Then, metal ions or a metal is adsorbed on the pattern of the ion-exchange groups.

For allowing the metal ions, the metal compound, or the metal colloid to be adsorbed on the ion-exchange groups, a substrate having a photosensitive layer formed thereon is brought into contact with a solution of metal ions, with a solution of metal compound, or with a metal colloid solution. For bringing the substrate into contact with the solution, it is most desirable to dip the substrate in the solution. It is also possible to spray the solution onto the substrate for coating the substrate with the solution.

An aqueous solution or an alcohol solution of an organic salt or an inorganic salt of gold, silver, platinum, palladium or copper, which is reduced so as to provide a catalyst of the electroless plating, is used as the solution of the metal ions. The metal ions are adsorbed on the ion-exchange group in the photosensitive layer as paired ions. The adsorbed metal ions are used as they are as the catalyst for the electroless plating. Alternatively, the adsorbed metal ions are reduced into a metal so as to provide the catalyst for the electroless plating. The ions of the metal lower in the ionization tendency than the metal used for the plating are reduced by the ions of the plating metal in the plating solution and, thus, a particular reducing treatment need not be applied to the ions of the metal noted above. In the case of applying, for example, a copper plating, the ions of gold, platinum, palladium, etc. can be used as they are. The copper ions are reduced into fine copper particles and, then, used as the catalyst for the electroless plating. It is possible to use known reducing agents such as formaldehyde, boron sodium hydride, dimethyl amine borane, trimethyl amine borane, hydrazine, and hypophosphite such as sodium hypophosphite.

The reducing agent is used in the form of a solution such as an aqueous solution, and the reduction is achieved by dipping the substrate in the solution. Incidentally, it is desirable to remove the extra metal ions by, for example, washing the substrate with water before the reduction.

As a metal compound solution, it is possible to use a solution of a metal compound such as complex ions of a metal or an organic complex of a metal. Used in one embodiment of the present invention is a metal compound having an atomic group such as an ion-exchange group capable of adsorption on an ion-exchange group or an atomic group capable of forming a covalent bond with an ion-exchange group.

Incidentally, the metal compound is an organic metal compound having an atomic group capable of adsorption on or coupling with an ion-exchange group. An organic metal complex is mainly used as such a metal compound.

In the organic metal complex, a bonding group is introduced into an organic metal complex consisting of a ligand such as a □-diketone derivative, a bipyridine derivative, a biquinoline derivative, a phenanthroline derivative or a porphyrin derivative.

The bonding group noted above includes, for example, a nitrogen-containing aromatic derivative group such as a primary, secondary or tertiary aliphatic or aromatic amino group or a pyridyl group and an onium base such as a quaternary ammonium base or a sulfonium base. It is advisable to impart solubility in water to these onium bases. In other words, it is advisable to use these onium bases in the form of a salt with a strong acid such as a hydrochloride or a sulfate. In this case, the ion-exchange group is treated with, for example, an aqueous solution of sodium borohydride, an aqueous solution of sodium carbonate, or an aqueous solution of potassium carbonate so as to provide a sodium salt or a potassium salt. If a metal-containing compound in the form of a hydrochloride or a sulfate is allowed to act on such a sodium salt or a potassium salt, it is possible to permit the metal compound to be adsorbed efficiently on the ion-exchange group.

The adsorbed metal compound is used as it is as a catalyst for the electroless plating. Alternatively, the adsorbed metal compound is reduced so as to be converted into the elemental metal that is used as a catalyst for the electroless plating.

It is possible to use an aqueous solution of the colloid of, for example, gold, silver, platinum or palladium as the metal colloid solution. Alternatively, it is also possible to use a solution using an organic solvent such as alcohol. In view of the storage stability of the metal colloid solution, it is desirable to use as the metal colloid a protected colloid protected by a protective substance such as a surface active agent or a polymer. In many cases, the metal colloid is charged positively or negatively. The polarity of the charge can be changed by changing the protective substance. The ion-exchange group is also charged in many cases within a liquid. The metal colloid is adsorbed by the electrostatic attractive force with the ion-exchange group. The metal colloid need not be reduced and can be used as it is as a catalyst for the electroless plating. Also, in the case of a protected colloid, it is possible to improve the activity as a catalyst by removing the protective substance by an etching using an acid, an alkaline solution or a solution of an oxidizing agent.

The metal colloid solution includes, for example, a palladium hydrosol. The palladium hydrosol can be prepared, for example, as follows. In the first step, an aqueous solution of a surface active agent is added to an aqueous solution containing palladium (II) chloride and sodium chloride while vigorously stirring the aqueous solution. Then, an aqueous solution of boron sodium hydride used as a reducing agent is added to the system so as to prepare a palladium hydrosol. The surface active agent, which is not particularly limited, includes, for example, stearyl trimethyl ammonium chloride, sodium dodecylbenzene sulfonate and polyethylene glycol mono-p-nonyl phenyl ether.

It is desirable for the concentration of the metal ion solution, metal compound solution, or the metal colloid solution to fall within a range of between 0.1% by weight and 30% by weight, more desirably between 1% by weight and 15% by weight. Where the concentration is unduly low, the metal ions, the metal compound, or the colloid fails to be adsorbed in a sufficiently large amount on the ion-exchange group. Also, the adsorption rate is low. It follows that a long time is required for the adsorption. On the other hand, where the concentration is excessively high, the metal ions, the metal compound, or colloid tends to be adsorbed without any order on also the region other than the region in which the ion-exchange groups are present. As a result, it is difficult to form a satisfactory composite member. The substrate is brought into contact with the metal ion solution, the metal compound solution, or the metal colloid solution by dipping the substrate in the solution. In general, the contact time, which is not particularly limited, falls within a range of between 10 seconds and 5 hours.

It is desirable to add, for example, a surface active agent to the metal ion solution, the metal compound solution, or the metal colloid solution in order to improve the wettability of the solution with the surface of the substrate. Particularly, in the case of using a porous substrate, it is desirable to add a surface active agent in order to permit the solution to permeate deep inside the porous substrate. It is desirable to use a fluorine-based surface active agent that is unlikely to be changed chemically. A similar effect can be obtained by using a solution of a supercritical fluid of the metal ion, the metal compound solution, or the metal colloid. The supercritical fluid produces a prominent effect because the supercritical fluid is well permeable into the inner region of a fine structure such as the inner region of a porous material.

Where the plating is applied to reach the inner region of a porous substrate, a better result can be obtained by using a metal ion solution. The metal colloid has a diffusion rate within a solution lower than that of the metal ion solution, with the result that it is difficult to diffuse the metal colloid sufficiently into the inner region of the porous substrate. On the other hand, the metal ions have a high diffusion rate so as to make it possible to allow the metal ions to be adsorbed sufficiently in the inner region of the porous substrate.

After the substrate is brought into contact with the metal ion solution, the metal compound solution, or the metal colloid solution, it is desirable to apply washing so as to remove the extra metal ions, the metal compound, or the metal colloid. For example, the washing is performed with a solvent, e.g., water, equal to the solvent of the metal ions, the metal compound solution, or the colloid solution. As a result, the solution attached to the region other than the region in which the ion-exchange groups are present is removed so as to prevent the region other than the region in which the ion-exchange groups are present from being plated without any order. The washing is particularly important in the case of using a porous substrate. In the case of using a substrate low in surface irregularities in which a solution tends to be accumulated such as a plate-like flat substrate, it is possible to blow away the extra solution of metal ions, of the metal compound, or of the colloid with a gaseous stream of air or nitrogen gas by using, for example, an air knife.

In the next step, electroless plating is applied, with the metal ions, the metal compound, or the metal colloid adsorbed on the ion-exchange groups used as the catalyst nuclei, so as to form a conductive pattern. The electroless plating can be performed by bringing the substrate having the metal ions, the metal compound, or the metal colloid adsorbed thereon as the catalytic nuclei into contact with the electroless plating solution, e.g., by dipping the substrate noted above in the electroless plating solution. The electroless plating solution is not particularly limited. It is possible to use the known plating solution of, for example, copper, nickel, gold, silver or platinum. The electroless plating proceeds with the metal ions, the metal compound, or the colloid adsorbed on the ion-exchange groups acting as the catalyst, with the result that the plating can be selectively achieved on only the region in which the ion-exchange groups are present.

As described above, it is possible to manufacture a composite member having a fine conductive pattern without causing the photosensitive layer to be dissolved in the plating solution so as to be peeled off by employing the manufacturing method according to one embodiment of the present invention.

The porous substrate according to another embodiment of the present invention will now be described.

In the porous substrate according to another embodiment of the present invention, a photosensitive layer is formed on the inner surfaces of the pores of an insulating porous body without closing the pores of the porous body. A wiring board having fine vias and wiring formed thereon can be easily manufactured by applying the manufacturing method of the composite member described above to the porous substrate noted above.

It is possible for the insulating material forming the porous body to be either an organic material or an inorganic material. Further, a composite material including an organic material and an inorganic material can also be used as the insulating material forming the porous body.

A polymer material is used in general as the organic material. The polymer material includes, for example, polyolefins such as polyethylene and polypropylene; polydienes such as polybutadiene, polyisoprene, polycyclohexadiene, and polyvinyl ethylene; acrylic resins such as polymethyl acrylate and polymethyl methacrylate; a polystyrene derivative; polyacrylonitrile derivatives such as polyacrylonitrile and polymethacrylonitrile; polyacetals such as polyoxymethylene; polyesters such as polyethylene terephthalate, polybutylene terephthalate and aromatic polyesters; polyarylates; aromatic polyamide such as aramid resin and polyamides such as nylon; polyimides; epoxy resins; aromatic polyethers; polyether sulfones; polysulfides; a fluorine-containing polymer such as polytetrafluoro ethylene; polybenzoxazoles; polyphenylenes such as polyparaphenylene; polyparaphenylene benzobisoxazole derivative; polyparaphenylene vinylene derivative; polysiloxane derivative; novolak resins; melamine resins and urethane resins.

On the other hand, ceramic materials are generally used as the inorganic material. The ceramic materials include, for example, metal oxides such as silica, alumina, titania, and potassium titanate as well as silicon carbide, silicon nitride and aluminum nitride.

It is desirable for the porous body to have open cells having open portions on the surface of the porous body. It is also desirable for the open cells to be formed in the form of a three-dimensional mesh structure. Where the open cells are formed in the form of a three-dimensional mesh structure, the metal plated within the open cells is rendered continuous a three-dimensionally so as to improve the mechanical strength and the conductivity. It is desirable for the average diameter of the open cells to fall within a range of between 0.05 $\mu$m and 5 $\mu$m, more desirably between 0.1 $\mu$m and 0.5 $\mu$m. Where the diameter of the cell is unduly small, the plating solution or the like tends to fail to permeate sufficiently into the inner region of the porous body. On the other hand, where the diameter of the cell is excessively large, it is difficult to form a fine pattern of the plated metal. Also, where the porous substrate is exposed to, for example, ultraviolet light or visible light, the light beam used for the light exposure is scattered by the porous structure so as to make it difficult to achieve the patterned light exposure with a high contrast.

It is desirable for the diameters of the pores of the porous body to be uniform. It is also desirable for the porosity to fall within a range of between 20% and 95%, more desirably between 45% and 90%. If the porosity is unduly low, it is possible for the plating solution to fail to permeate sufficiently or to fail to improve sufficiently the conductivity of the pattern of the plated metal. On the other hand, if the porosity is excessively high, the porous body fails to exhibit a sufficiently high mechanical strength. Also, the dimensional stability of the porous body is lowered. It is desirable for the pores to form an open cell and to have an open portion communicating with the outside of the porous body. It is difficult for the plating solution to permeate into the closed cells that do not have open portions so as to make it difficult to achieve satisfactory plating. It is desirable for the ratio of the closed cells to the entire pores of the porous body to be not higher than 50% by volume, more desirably, not higher than 10% by volume.

The porous body includes a porous sheet having three-dimensional open cells formed in a sheet of a polymer material and a cloth or an unwoven fabric in which polymer fibers or ceramic fibers are entangled in a three-dimensional mesh-like structure. It is more desirable to use the porous sheet in view of the dimensional stability. Also, the unwoven fabric is superior to the cloth because the unwoven fabric permits controlling finely and uniformly the pore diameter.

The manufacturing method of the porous sheet is not particularly limited. For example, it is possible to manufacture the porous sheet by elongating a sheet of a crystalline polymer such as polypropylene or polytetrafluoro ethylene. It is also possible to use a porous sheet formed by utilizing the spinodal decomposition or the phase separation phenomenon such as micro-phase separation. Further, it is possible to use a porous sheet formed by the emulsion templating method using a surface active agent. Still further, it is possible to use a porous sheet prepared by loading a polymer or ceramic particles in voids of an aggregate of silica or polymer beads, followed by curing the polymer or ceramic particles and subsequently removing the beads. The particular porous sheet is reported by Y. A. Vlasov et al. in "Adv. Mater. 11, No. 2, 165, 19991" and by S. A. Johnson et al. in "Science Vol.283, 963, 1999". It is also possible to use a porous body prepared by using an aggregate of cells or liquid bubbles in place of the beads as reported by, for example, S. H. Park et al. in "Adv. Mater. 10, No. 13, 1045, 1998" and by S. A. Jenekhe et al. in "Science Vol. 283, 372, 1999". Further, it is possible to use a porous body prepared by employing a three-dimensional optical forming method as reported by B. H. Cumpston et al. in "Nature, vol. 398, 51, 1999" and by Campbell et al. in "Nature, vol. 404, 53, 2000".

The cloth and unwoven fabric are formed of ceramic fibers or polymer fibers. The ceramic fibers include, for example, a silica glass fiber, an alumina fiber, a silicon carbide fiber, and potassium titanate fiber. On the other hand, the polymer fibers include, for example, fibers of a liquid crystal-type polymer and a high Tg polymer such as an aromatic polyamide fiber, and an aromatic polyester fiber; fluorine-based polymer fibers such as a PTFE fiber; polyparaphenylene sulfide fiber; aromatic polyimide fibers; and polybenzoxazole derivative fibers. It is possible to use the ceramic fiber and the polymer fiber in combination. It is also possible to use a composite fiber of a ceramic material and a polymer material. When it comes to the unwoven fabric, it is particularly desirable to use an unwoven fabric of a polymer manufactured by a melt blow method. The unwoven fabric of this type has a fine fiber diameter and a uniform pore diameter. Also, it is possible to use an unwoven fabric made of fibers of a liquid crystalline polymer such as an aramid fiber having a diameter of about 0.1 to 0.3 µm. It is also possible to use a paper-like unwoven fabric made from short fibers of a polymer or a ceramic material. It is desirable for the fiber diameter to be fine because the light beam used for the light exposure is unlikely to be scattered by the fiber having a fine diameter so as to make it possible to form a fine conductive pattern. Specifically, it is desirable for the average fiber diameter to be not larger than 5 µm, more desirably not larger than 0.5 µm.

The porous body is not limited to a sheet-like porous body. It is also possible for the porous body to be, for example, fibrous, hollow string-like, spherical and bulky. The porous bodies of these shapes can be selected appropriately depending on the use of the porous body. For example, it is possible to use a porous sheet having a thickness of, for example, about 10 to 100 µm, a pore diameter of about 0.1 to 0.5 µm, and a porosity of about 60 to 85% as a sheet-like porous body used for manufacturing a flexible wiring board or a multi-layered wiring board. Specifically, it is possible to use a polyimide porous sheet manufactured by a spinodal decomposition or a microphase separation or a porous sheet of polytetrafluoro ethylene manufactured by an elongation method.

Formed on the inner surfaces of the pores of the porous body are photosensitive layers containing a photosensitive compound capable of forming or eliminating ion-exchange groups upon irradiation with an energy beam and a crosslinkable compound or photosensitive layers containing a photosensitive polymer having a photosensitive group capable of forming or eliminating ion-exchange groups upon irradiation with an energy beam and a crosslinkable group.

The photosensitive layer can be formed in general by coating a porous body with a photosensitive composition or a solution of a photosensitive material. The means for the solution coating is not particularly limited. It is possible to use, for example, a dipping method, a spin coating method or a spraying method. It is also possible to form the photosensitive layer by a vapor deposition method or a CVD method in addition to the coating method of the solution.

The porous substrate having the photosensitive layer formed on the inner surface of the pores of the porous substrate can be suitably used for the manufacturing method of a composite body according to one embodiment of the present invention. It follows that it is desirable to form the photosensitive layer in a thickness adapted for the selective light exposure in a pattern and for the plating as already described.

It is desirable for the thickness of the photosensitive layer formed on the surface of the porous body to fall within a range of between 10 nm and 100 nm, more desirably between 20 nm and 50 nm. Where the photosensitive layer is unduly thin, the ion-exchange groups are not present in a sufficiently large amount. Also, the adsorption amounts of the metal ions, the metal compound, or the metal colloid are not sufficiently large. It follows that it is difficult to achieve a satisfactory plating. On the other hand, where the photosensitive layer is excessively thick, the pores within the porous body tend to be closed. Also, the irradiated energy beam is absorbed completely in the vicinity of the surface of the porous body, resulting in failure for the photosensitive layer in the inner region of the porous body to be sensitized sufficiently.

The porous substrate according to another embodiment of the present invention is desirable for the substrate surface to be covered with a protective film of a polymer or a metal. When it comes to, for example, a sheet-like porous substrate, it is desirable for the porous substrate to held between two protective films. The protective film covering the porous substrate serves to prevent oxygen and humidity from entering the inner region of the porous body so as to prevent the photosensitive layer from being deteriorated. It follows that the storage stability of the porous substrate can be markedly improved.

It is also possible to arrange a light shielding protective film so as to prevent the abnormal sensitization of the photosensitive layer. The protective film is removed in general before or after the energy beam irradiation, followed by performing the adsorption process of the metal ions, the metal compound, or the metal colloid and the plating process. The protective film is selected from the group consisting of a polymer film made of, for example, polyethylene terephthalate and having a thickness of generally about 5 to 30 µm, a metal foil such as an aluminum foil or a stainless steel foil, and a composite film including a polymer film such as a polyethylene terephthalate film and a silica gel film or an aluminum film formed by, for example, vapor deposition on the surface of the polymer film.

Where the manufacturing method of the composite member described above is consecutively performed by the roll-to-roll method by using a sheet-like porous substrate, it is possible for the protective film to perform the function of a carrier film so as to improve the dimensional stability of the porous body. Where the protective film is used as a carrier film, one of the protective films formed on the front surface and the back surface of the porous substrate is removed, and the remaining protective film is used in the subsequent adsorption process and the plating process.

As described above, a composite member having a conductive pattern such as fine wiring can be manufactured by a simple process by using the method according to one embodiment of the present invention. To be more specific, the satisfactory composite member can be manufactured by the simple process of coating the substrate with a photosensitive composition or a photosensitive material, followed by applying a light exposure treatment and an electroless plating treatment.

Also, the photosensitive composition and the porous substrate according to another embodiment of the present invention can be suitably used in the method described above.

A manufacturing method of a composite member, a photosensitive composition, an insulating body and a composite member according to another embodiment of the present invention will now be described.

The manufacturing method of a composite member having a conductive pattern according to another embodiment of the present invention comprises:

(1) forming on a surface of an insulating body a photosensitive layer containing a photo acid generating agent and a compound forming an ion-exchange group in the presence of an acid;

(2) selectively exposing said photosensitive layer to an energy beam so as to generate an acid in the exposed portion;

(3) forming a pattern of ion-exchange groups by allowing the acid generated by the selectively exposing in the exposed portion of the photosensitive layer to form an ion-exchange group; and (4) forming a composite member having conductive pattern by allowing a metal ion, a metal compound, or a metal colloids to be adsorbed on the pattern of ion-exchange groups, wherein the compound forming an ion-exchange group in the presence of the acid is a copolymer having a first repeating unit having ion-exchange groups and a second repeating unit having an atomic group not decomposed by an acid and insoluble in an alkali, and some or all of said ion-exchange groups are protected by a protective group.

As a result of extensive research onto the method of manufacturing a composite member having a fine conductive pattern, the present inventors have found that, in a photosensitive composition, it is possible to achieve the light exposure with an exposing light having a wavelength excellent in the light transmittance and differing from the wavelength of the light absorbed by the substrate and the compound generating ion-exchange groups by separating the two reactions, i.e., the light exposure reaction performed by the light and the reaction to generate the ion-exchange groups. It has also been found that the resolution can be improved by allowing the compound to have a repeating unit having the ion-exchange groups and another repeating unit having atomic groups that are not decomposed by an acid and are insoluble in an alkali so as to have the roles of the ion exchange and the adhesion to the substrate played separately. As a result, it has been made possible to manufacture easily and with a low cost a composite member having a fine conductive portion formed selectively in an insulating body.

The concept of another embodiment of the present invention will now be described first. The following description is directed to the case of forming a metal steric wiring on the surface and in the inner region of a porous insulating body. The description is simplified for facilitating the understanding of the technical idea of the present invention. Of course, the present invention is not limited to the particular description given below.

In another embodiment of the present invention, a conductive pattern is formed on the surface and in the inner region of a porous substrate of a nanometer order to micron order. The substrate is required to exhibit a heat resistance and dielectric constant that are low to some extent. The material meeting these conditions greatly absorbs ultraviolet light and, thus, it is difficult to use an ultraviolet light for the light exposure. Such being the situation, the present inventors have designed a system in which an optical reaction is brought about with a wavelength differing from the absorption wavelength of the substrate.

The photosensitive composition used contains a photo acid generating agent and a compound generating ion-exchange groups in the presence of an acid. It is possible to select the photo acid generating agent that is capable of reaction with light rays of various wavelengths depending on the kind. Therefore, it is possible to select appropriately the photo acid generating agent that is sensitive to the wavelength other than the wavelength of the light greatly absorbed by the substrate. Further, when it comes to the substrate such as polyimide having a large absorption in all the wavelength regions not longer than 450 nm, it is possible to add a photosensitizer so as to permit sensitization to light having a wavelength not shorter than 500 nm.

The acid generated by the light irradiation acts on the compound generating an ion-exchange group that is chemically protected so as to bring about a de-protection reaction so as to generate ion-exchange groups. As a result, the ion-exchange groups are caused to be present selectively in the exposed portion exposed in a pattern. Since the selective light exposure in a pattern is performed by using light having a wavelength low in absorption by an insulating body, the inner region of the insulating body is also exposed to light in the case where the insulating body is porous.

In the next step, the metal ions or the metal is allowed to be adsorbed on the ion-exchange groups formed in the exposed portion by the selective light exposure in a pattern. Further, the metal ions adsorbed on the ion-exchange groups in the exposed portion are subjected to a reducing treatment so as to convert the metal ions into elemental metal, thereby forming a conductive portion.

Further, electroless plating is applied to the conductive portion formed in the exposed portion in order to improve the conductivity. As a result, it is possible to obtain a porous insulating body having steric metal wiring formed on the surface and in the inner region.

As described previously, the compound generating ion-exchange groups in the presence of an acid includes a first repeating unit having the ion-exchange groups and a second repeating unit that is not decomposed by acid and is insoluble in alkali. The presence of the second repeating unit serves to prevent the photosensitive composition layer from being eluted in the subsequent step of coupling the metal or the metal ions so as to make it possible to manufacture a composite member having a fine pattern.

Another embodiment of the present invention will now be described in detail.

The manufacturing method of a composite member having a conductive patter will be described first.

The manufacturing method of a composite member according to another embodiment of the present invention will now be described, covering the case where a conductive portion is formed over the planar direction and the thickness direction of a sheet-like insulating body.

In the first step, a conductive portion having a fine pattern is formed on an insulating body. In this case, formed is a composite member having a fine conductive pattern in the planar direction and the thickness direction of a porous sheet-like insulating body by using a photosensitive composition containing a photo acid generating agent and a compound generating ion-exchange groups in the presence of an acid.

In this embodiment, used is a photosensitive composition containing a photo acid generating agent and a compound generating ion-exchange groups in the presence of an acid. To be more specific, the photosensitive composition layer is selectively exposed to light in a pattern by using visible light or ultraviolet light so as to generate an acid in the exposed portion, and ion-exchange groups are formed by the acid thus generated. Since the particular composition is used, it is possible to make the substrate and the photosensitive composition widely different from each other in the absorbed wavelength and in the light exposure wavelength.

The photo acid generating agent denotes a compound generating an acid upon irradiation with actinic radiation. The photo acid generating agent includes, for example, triphenyl sulfonium triflate, triphenyl sulfonium hexafluoro antimonate, triphenyl sulfonium naphthalene sulfonate, diphenyl iodonium triflate, diphenyl iodonium pyrene sulfonate, diphenyl iodonium dodecylbenzene sulfonate, bis (4, -tert-butyl phenyl)iodonium triflate, bis(4-tert-butyl phenyl)iodonium dodecylbenzene sulfonate, bis(4-tert-butyl phenyl)iodonium naphthalene sulfonate, bis(4-tert-buty phenyl)iodonium hexafluoro antimonate, (hydroxy phenyl) benzene methyl sulfonium toluene sulfonate, 1-(naphthyl acetomethyl)thioranium triflate, cyclohexyl methyl(2-oxocyclohexyl)sulfonium triflate, dicyclohexyl(2-oxocyclohexyl)sulfonium triflate, dimethyl(2-oxocyclohexyl)sulfonium triflate, S-(trifluoromethyl) dibenzothiophenyl trifluoromethane sulfonic acid, Se-(trifluoromethyl dibenzothiophenium trifluoromethane sulfonic acid, an iodonium salt of I-dibenzothiophenium trifluoromethane sulfonic acid or the like, onium salt such as sulfonium salt, phosphonium salt, diazonium salt, pyridinium salt; diazide ketone compounds such as 1,2-naphthoquinone diazide-4-sulfonyl chloride, 1,2-naphthoquinone diazide-4-sulfonic acid ester of 2,3,4,4-tetrahydro benzophenone and 1,3-diketo-2-diazo compound such as 1,2-naphthoquinone diazide-4-sulfonic acid ester of 1,1,1-tris(4-hydroxy phenyl)ethane, diazo benzoquinone compound, diazo naphotoquinone compound; hydrocarbon compounds having a haloalkyl group such as 1,1-bis(4-chlorophenyl)-2,2,2-trichloroethane, phenyl-bis(trichloromethyl)-S-triazine, naphthyl-bis-(trichloromethyl)-S-triazine; halogen-containing compounds such as a heterocyclic compound having a haloalkyl group; sulfone compounds such as 4-trisphenacyl sulfone, mesithyl phenacyl sulfone, □-ketosulfone such as bis(phenyl sulfone)methane, and sulfone compound such as □-sulfonyl sulfone; and triazine-based compounds such as 2-[2-(5-methyl furan-2-yl)ethenyl]-4,6-bis (trichloromethyl)-s-triazine, 2-[2-(furan-2-yl) ethenyl]-4,6-bis(trichloromethyl)-s-triazine, 2-[2-(4-diethylamino-2-methylphenyl)ethenyl]-4,6-bis (trichloromethyl)-s-triazine, 2-[2-(diethylamino ethyl)amino]-4,6-bis(trichloromethyl)-s-triazine.dimethyl sulfate, 2-[2-(3,4-dimethoxyphenyl) ethenyl]-4,6-bis(trichloromethyl)-s-triazine, 2-(4-dimethoxy phenyl)-4,6-bis(trichloromethyl)s-triazine, 2-methyl-4,6-bis(trichloromethyl)-s-triazine, and 2,4,6-tris(trichloromethyl)-s-triazine.

Among the compounds enumerated above, it is more desirable to use conjugated polycyclic aromatic compounds because the wavelength of the absorbed light is shifted toward the longer wavelength.

Incidentally, the conjugated composite aromatic ring denotes a molecular structure in which a plurality of aromatic rings are in a conjugated state. Also, the term "conjugation" denotes the state that double bonds are positioned in every two bonds in a state close to a plane.

The conjugated composite aromatic rings include, for example, a naphthalene ring, an anthracene ring, a phenanthrene ring, a pyrene ring, naphthacene ring, a chrysene ring, a 3,4-benzophenanthrene ring, a perylene ring, a pentacene ring, and a picene ring. The conjugated composite aromatic rings also include, for example, a pyrrole ring, a benzo furan ring, a benzothiophene ring, an indole ring, a benzoxazole ring, a benzothiazole ring, an indazole ring, a curomene ring, a quinoline jinnoline ring, a phthalazine ring, a quinazoline ring, a dibenzo furan ring, a carbazole ring, an alcidine ring, a phenanthredine ring, a phenanthroline ring, a phenazine ring, a thianthrene ring, an indolidine ring, a naphthylidine ring, a purine ring, a pteridine ring, and a fluorene ring. Particularly, it is desirable to use a compound in which the aromatic ring is selected from the group consisting of a naphthalene ring, an anthracene ring and a phenanthrene ring, because the particular compound is high in its transparency and resistance to the dry etching. It is possible to introduce the conjugated composite aromatic ring into the backbone chain skeleton and the side chain skeleton of the photo acid generating agent. Alternatively, it is also possible to introduce the conjugated composite aromatic ring into the backbone chain skeleton or the side chain skeleton of the photosensitizer described herein later.

To be more specific, the photo acid generating agent includes, for example, an onium salt having a naphthalene skeleton or a benzothiophene skeleton as well as a sulfonate compound, a sulfonyl compound and a sulfamide compound. The specific compounds of the photo acid generating agent include, for example, sulfonium salts having a naphthalene ring such as NAT-105 (manufactured by Midori Kagaku K.K.) and NDS-105 (manufactured by Midori Kagaku K.K.); a naphthalene-containing chlorinated triazine such as NDI-106 (manufactured by Midori Kagaku K.K.); an onium salt of sulfonic acid imide dibenzothiophene derivative such as naphthalydil triflate; and naphthalene bisulfone.

It is desirable for the addition amount of the photo acid generating agent to the ion-exchangeable compound to be not smaller than 0.1% and smaller than 20%. If the addition amount of the photo acid generating agent is smaller than 0.1%, the sensitivity tends to be lowered. If the addition amount is 20% or more, however, the performance of the coated film is markedly lowered, with the result that the coated film tends to elute into the plating solution, which is an alkaline solution, in the plating step.

Where a sufficient sensitivity cannot be obtained by using the photo acid generating agent alone or where the light exposure is to be performed by using light having a longer wavelength, it is necessary to add a photosensitizer. The photosensitizer is not particularly limited as far as it is possible to photosensitive the compound generating the ion-exchange groups upon exposure to light. Naturally, the photosensitizer is selected appropriately depending on the kind of the compound used and the light source used.

The specific photosensitizers include, for example, an aromatic hydrocarbon and its derivative, benzophenone and its derivative, o-benzoyl benzoic acid ester and its derivative, acetophenone and its derivative, benzoin and benzoin ether and its derivative, xanthone and its derivative, thioxanthone and its derivative, a disulfide compound, a quinone-based compound, a halogenated hydrocarbon-containing compound, amines, melocyanine-based coloring matters such as 3-ethyl-5-[(3-ethyl-2(3H)-benzothiazolylidene)ethylidene]-2-thioxo-4-oxazolidinone, 5-[(1,3-dihydro-1,3,3-trimethyl-2H-indole-2-ylidene) ethylidene]-3-ethyl-2-thioxo-4-oxazolidinone; cyanine-based coloring matters such as 3-butyl-1,1-dimethyl-2-[2-[2-diphenylamino-3-[(3-butyl-1,3-dihydro-1,1-dimethyl-2H-benz[I]indole-2-ylidene)ethylidene]-1-cyclopentene-1-yl]ethyenyl]-1H-benz[I]indolium, percholate, 2-[2-[2-chloro-3-[(3-ethyl-1,3-dihydro-1,1-dimethyl-2H-benz[I] indole-2-ylidene)ethylidene]-1-cyclohexene-1-yl]ethenyl]-1,1-dimethyl-3-ethyl-1H-benz[e]indolium tetrafluoro borate, and 2-[2-[2-chloro-3-[(3-ethyl-1,3-dihydro-1,1-dimethyl-2H-benz[e]indole-2-ylidene)ethylidene-]1-cyclopentene-1-yl]ethenyl]-1,1-dimethyl-3-ethyl-1H-benz[e]indolium iodide; squalium-series cyanine coloring matters; styryl-based coloring matters such as 2-[p-(dimethylamino)styryl]benzothiazole, 2-[p-(dimethylamino)styryl]naphtho[1,2-d]thiazole, and 2-[(m-hydroxy-p-methoxy)styryl]benzothiazole; xanthene coloring matters such as eosine B(C.I. No. 45400), eosine J(C.I. No. 45380), cyanosine (C.I. No. 45410), Bengal rose, erythrosine (C.I. No. 45430), 2,3,7-trihydroxy-9-phenyl xanthene-6-one, and Rhodamine 6G; thiazine coloring matters such as thionine (C.I. No. 52000), azule A (C.I. No. 52005), and azule C (C.I. No. 52002); pyronine coloring matters such as pyronine B (C.I. No. 45005), pyronine GY (C.I. No. 45005); cumarin-based coloring matters such as 3-acetyl cumarin, 3-acetyl-7-diethylamino cumarin, 3-(2-benzothiazolyl)-7-(diethylamino)cumarin, 3-(2-benzothiazolyl)-7-(dibutylamino)cumarin, 3-(2-benzimidazolyl)-7-diethylamino)cumarin, 10-(2-benzothiazolyl)-2,3,6,7-tetrahydro-1,1,7,7-tetramethyl-1H, 5H,11H-[1]benzopyrano[6,7,8-ij]quinolidine-11-one, 3-(2- benzothizolyl)-7-(dioctylamino)cumarin, 3-carbotoxy-7-(diethylamino)cumarin, and 10-[3-[4-(dimethylamino) phenyl]-1-oxo-2-propenyl]-2,3,6,7-tetrahydro-1,1,7,7-tetramethyl-1H,5H,11H-[1]benzopyrano[6,7,8-ij] quinolidine-11-one; ketocumarin-based coloring matters such as 3,3'-carbonyl bis(7-diethylamino cumarin), 3,3'-carbonyl-7-diethylamino cumarin-7'-bis(butoxyethyl)amino cumarin, and 3,3'-carbony bis(7-dibutylamino cumarin); and DCM-based coloring matters such as 4-(dicyanomethylene)-2-methyl-6-(p-dimethylamino styryl)-4H-pyran and 4-(dicyanomethylene)-2-methyl-6-(p-dibutylamino styryl)-4H-pyran.

It is desirable for the mixing amount of the photosensitizer based on the molar concentration of the photo acid generating agent described previously to fall within a range of, generally, between 0.001 mol and 10 mols, more desirably between 0.1 mol and 1 mol.

It is desirable for the compound generating ion-exchange groups by an acid catalytic reaction in the presence of an acid to be a copolymer including a first repetition unit having an ion-exchange group and a second repetition group having an atomic group that is not decomposed by an acid and is insoluble in an alkali.

The first repetition unit generating an ion-exchange group includes, for example, repetition units of a novolak resin such as a phenol novolak resin or a naphthol novolak resin; backbone chain alicyclic polymers such as polyisobornene, polynorbornene, polycyclohexene, polycyclopentene, polycycloheptene and polycyclooctene, a carboxyl group or a sulfonyl group being partly substituted for the side chain of said backbone chain alicyclic polymers; phenolic resins such as polyhydroxy styrene and polyhydroxy vinyl naphthalene; poly □-chloroacrylate and polycyanoacrylate. It is also possible to use the repetition units of polymers having a sulfonyl group substituted for the hydroxyl groups of novolak resins and phenolic resins.

In the first repetition unit, it is necessary for some or all of the ion-exchange groups to be protected by the protective group that is removed by an acid described below. The acid generated from the photo acid generating agent by the light exposure removes the protective group protecting the ion-exchange group so as to generate ion-exchange groups, with the result that metal ions are adsorbed on the exposed portion. It follows that it is possible to transfer the metal pattern in accordance with the pattern of the light.

The second repetition unit having an atomic group that is not decomposed by an acid and is insoluble in an alkali includes, for example, the repetition units of backbone chain alicyclic polymers such polyisobornene, polynorbornene, polycyclohexene, polycyclopentene, polycycloheptene, polycyclooctene and polymers having an alkyl group substituted for a part of the side chains of the backbone chain alicyclic polymers; polymethacrylic acid esters and polyacrylic acid esters, said esters being not decomposed by an acid, such as poly □-methyl styrene, polystyrene, polyvinyl naphthalene, polymethyl methacrylate, polymethyl acrylate, polyisobornyl methacrylate, polyisobornyl acrylate, polymenthyl methacrylate, polymenthyl acrylate, polynorbornyl methacrylate, polynorbornyl acrylate, polyadamantyl methacrylate, polyadamantyl acrylate, polyallyl methacrylate, polyallyl acrylate, polynaphthol methacrylate, and polynaphthol acrylate; and high molecular weight compounds having a polar group not attached to the side chain such as polysilane, polyesters, polyamides and polyimides.

The copolymer obtained by copolymerizing the first and second repetition units described above is used as the compound in this embodiment of the present invention. In general, the photosensitive composition used as a resist for processing an electronic device is required to be dissolved in a developing solution for resolving the pattern. On the other hand, in this embodiment of the present invention, the compound constituting the main component of the photosensitive composition is required to remain on the surface of the porous body even after dipped in a plating solution (alkaline solution) required in the subsequent plating step. It follows that the compound eluting in the alkaline solution of the plating solution fails to achieve the object of this embodiment of the present invention.

In the compound, the ion-exchange group included in the first repetition unit is a polar group and, thus, is soluble in an alkali after the decomposing step of the protective group with an acid. The metal ionic acid forming the nucleus of the plating is adsorbed on that portion. Since the plating grows catalytically with the metal ion providing the nucleus, the polar group on which is adsorbed the ion need not be present on all the repetition units of the compound. On the other hand, since the compound is a copolymer with a hydrophobic repetition unit that is not decomposed by an acid, it is possible to prevent the compound from being eluted in the plating step.

It is desirable for the molar ratio of the first repetition unit having an ion-exchange group to the second repetition unit having an atomic group that is not decomposed by an acid and is insoluble in an alkali to fall within a range of between 10:90 and 75:25. Where the molar ratio of the first repetition unit having a polar group is lower than the lower limit of the range noted, the formation of the plating nuclei does not proceed so as to make it difficult to allow the plating to proceed sufficiently. On the other hand, where the molar ratio of the second repetition unit that does not have a polar group is lower than the lower limit of the range noted above, the second repetition unit tends to elute into the plating solution so as to prevent the plating from proceeding. In order to achieve the transfer of a finer plating pattern, it is more desirable for the molar ratio noted above to fall within a range of between 20:80 and 50:50.

It is desirable for the polystyrene-converted weight average molecular weight (Mw) of the compound, which can be changed in accordance with the desired characteristics of the photosensitive composition, to fall within a range of between 2,000 and 150,000, more desirably between 10,000 and 80,000. Where the weight average molecular weight Mw is lower than 2,000, the film-forming properties and the bonding strength to the porous body tend to be rendered poor. On the other hand, where the weight average molecular weight Mw exceeds 150,000, the resolution and the plating characteristics tend to be rendered poor. It is desirable for the molecular weight dispersion Mw/Mn of the compound to fall within a range of between 1 and 5, more desirably between 1 and 3.

The protective group which is removed by an acid includes, for example, a t-butyl group, a t-butoxy carbonyl group, an acetyl group, a 1-methoxy ethyl group, a 1-ethoxy ethyl group, a 1-butoxy ethyl group, a 1-pentoxy ethyl group, a tetrahydropyranyl group, a methyl tetrahydropyranyl group, a tetrahydrofuranyl group, a methyl tetrahydrofuranyl group, a carbobutoxy methyl group, a carbobutoxy ethyl group, a carbobutoxy propyl group, and a trialkyl silyl group. Particularly, it is desirable to use a t-butyl group, a t-butoxy carbonyl group, a 1-ethoxy ethyl group, 1-butoxy ethyl group, a tetrahydropyranyl group, a methyl tetrahydropyranyl group, a tetrahydrofuranyl group and a methyl tetrahydrofuranyl group.

Further, the substituent group which is removed by an acid includes, for example, esters such as t-butyl ester, isopropyl ester, ethyl ester, methyl ester, benzyl ester; ethers such as tetrahydropyranyl ether; alkoxy carbonates such as t-butoxy carbonate, methoxy carbonate, and ethoxy carbonate; silyl ethers such as trimethyl silyl ether, triethyl silyl ether, and triphenyl silyl ether; esters such as isopropyl ester, tetrahydropyranyl ester, tetrahydrofuranyl ester, methoxy ethoxy methyl ester, 2-trimethyl silyl ethoxy methyl ester, 3-oxo cyclohexyl ester, isobornyl ester, trimethyl silyl ester, triethyl silyl ester, isopropyl dimethyl silyl ester, di-t-butyl methyl silyl ester, oxazole, 2-alkyl-1,3-oxazoline, 4-alkyl-5-oxo-1,3-oxazoline, 5-alkyl-4-oxo-1,3-dioxolane; ethers such as t-butoxy carbonyl ether, t-butoxy methyl ether, 4-pentenyloxy methyl ether, tetrahydropyranyl ether, tetrahydro thiopyranyl ether, 3-bromo tetrahydropyranyl ether, 1-methoxy cyclohexyl ether, 4-methoxy tetrahydropyranyl ether, 4-methoxy tetrahydro thiopyranyl ether, 1,4-dioxane-2-yl ether, tetrahydrofranyl ether, tetrahydro thiofuranyl ether, 2,3,3a,4,5,6,7,7a-octahydro-7,8,8-trimethyl-4,7-methanobenzofuran-2-yl ether, t-butyl ether, trimethyl silyl ether, triethyl silyl ether, triisopropyl silyl ether, dimethyl isopropyl silyl ether, diethyl isopropyl silyl ether, dimethyl thexyl silyl ether and t-butyl dimethyl silyl ether; acetals such as methylene acetal, ethylidene acetal and 2,2,2-trichloroethyliden acetal; ketals such as 1-t-butyl ethylidene ketal, isopropylidene ketal (acetonide), cyclopentylidene ketal, cyclohexylidene ketal and cycloheptylidene ketal; cyclic ortho-esters such as methoxy methylene acetal, ethoxy methylene acetal, dimethoxy methylene ortho-ester, 1-methoxy ethylidene ortho-ester, 1-ethoxy ethylidene ortho-ester, 1,2-dimethoxy ethylidene ortho-ester, 1-N,N-dimethylamino ethylidene ortho-ester and 2-oxa cyclopentylidene ortho-ester; silyl ketene acetals such as trimethyl silyl ketene acetal, triethyl silyl ketene acetal and t-butyl dimethyl silyl ketene acetal; silyl ethers such as di-t-butyl silyl ether, 1,3-1',1',3',3'-tetraisopropyl disiloxanylidene ether and tetra-t-butoxy disiloxane-1,3-diylidene ether; non-cyclic acetals and ketals such as dimethyl acetal, dimethyl ketal, bis-2,2,2-trichloroethyl acetal, bis-2,2,2-trichloroethyl ketal, diacetyl acetal, and diacetyl ketal; cyclic acetals and ketals such as 1,3-dioxane, 5-methylene-1,3-dioxane, 5,5-dibromo-1,3-dioxane, 1,3-dioxorane, 4-bromomethyl-1,3-dioxorane, 4,3'-butenyl-1,3-dioxorane and 4,5-dimethoxy methyl-1,3-dioxorane; and cyanohydrins such as O-trimethyl silyl cyanohydrin, O-1-ethoxy ethyl cyanohydrin, and O-tetrahydropyranyl cyanohydrin.

The rate of introduction of the protective group, which is easily removed under the action of an acid, into the compound, i.e., the ratio of the number of protected acidic functional groups to the number of the sum of the acidic functional groups in the compound, in which the protective group is liberated under the action of an acid so as to be converted into an ion-exchange group, and the protected acidic functional groups, should generally be 15 to 100 mol %, preferably 20 to 100 mol %, though it is difficult to define unconditionally the rate of introduction noted above.

It is desirable for the compound according to another embodiment of the present invention to be a high molecular weight compound having an acryl skeleton and/or styrene skeleton in the backbone chain because the particular high molecular weight compound has a high bonding strength to the substrate and does not elute into the alkaline solution in the plating step. For example, each of a copolymer between polymethyl methacrylate and tetrahydropyranyl methacrylate and a copolymer between polystyrene and poly-t-butoxy carbonyl methoxy styrene has a high bonding strength to the substrate and is excellent in sensitivity. Also, t-butyl methacrylate has a high decomposition temperature of about 150° C. and, thus, a copolymer between polymethyl methacrylate and t-butyl methacrylate is excellent in its heat resistance. It follows that it is desirable to use these copolymers in the case of using a substrate having a high glass transition point such as a polyimide substrate. It is possible to impart the same performance by using an acrylate in place of the methacrylate.

As described above, each of tetrahydropyranyl methacrylate, poly-t-butoxy carbonyl methoxy styrene and t-butyl methacrylate can be decomposed with a small amount of acid and exhibits a high sensitivity. It follows that these compounds are excellent when used as a protective group of the ion-exchange group. In other words, it is desirable to use the tetrahydropyranyl group, the t-butyl group and the t-butoxy carbonyl methyl group as the protective group.

Where the sulfonyl group, the carboxyl group and the phenolic hydroxyl group each acting as the ion-exchange group are protected by the protective group noted above, the plating nuclei tend to be generated easily in the plating step. Naturally, it is desirable for the sulfonyl group, the carboxyl group and the phenolic hydroxyl group noted above to be protected by the protective group noted above. In other words, in the compound contained in the photosensitive composition according to another embodiment of the present invention, it is desirable for the repetition unit generating the ion-exchange group to have at least one atomic group selected from the group consisting of a sulfonium ester group, a carboxylic acid ester group and a phenol derivative group.

The photosensitive composition according to another embodiment of the present invention is subjected to an acid decomposition even if used singly so as to form a pattern. However, it is possible to improve further the sensitivity by mixing as a dissolution inhibiting agent a compound having an acid-decomposable group introduced therein, said acid-decomposable group having a dissolution inhibiting capability relative to an alkaline solution. It is possible to use, for example, a compound exhibiting a sufficient dissolution inhibiting capability relative to an alkaline solution and having an acid-decomposable group allowing the product after decomposition under the action of an acid to generate —(C=O)OH, —S(=O)—OH or —OH within an alkaline solution as the dissolution inhibiting agent.

The particular compound can be obtained by introducing an acid-decomposable group into aromatic compounds having a low molecular weight such as bisphenol A, bisphenol F, tri(hydroxy phenyl)methane, phenolphthalein, cresolphthalein, thymolphthalein, catechol, pyrogallol, naphthol, bisnaphthol A, bisnaphthol F and a benzoic acid derivative and aliphatic alcohols having a low molecular weight such as cholate, steroids, terpenoids and sugars.

It is possible to use as the dissolution inhibiting agent the compounds disclosed in, for example, U.S. Pat. Nos. 4,491, 628, 4,603,101 and Japanese Patent Disclosure (Kokai) No. 63-27829. It is also possible to use as the dissolution inhibiting agent the compound having a carboxylic acid or a phenolic hydroxyl group in which a protective group that can be decomposed with an acid is substituted for a part or all of the hydroxyl terminals. The protective group noted above includes, for example, tert-butyl ester, tert-butyl carbonate, tetrahydro pyranyl group and acetal group. These compounds include, for example, tert-butyl carbonate of polyhydroxy compound of phenol, naphthol and anthracene, tert-butyl carbonate of phenolphthalein and naphtholphthalein, and tert-butyl carbonate of quinazalin, quinizalin, phenol novolak resin and naphthol novolak resin.

It is desirable for the addition amount of these compounds of the dissolution inhibiting agent to the compound to be at least 3% by weight and to be less than 40% by weight. If the addition amount of the dissolution inhibiting agent to the photosensitive composition is smaller than 3% by weight, the resolution tends to be lowered. On the other hand, if the addition amount exceeds 40% by weight, the film-forming capability or the dissolution rate tends to be markedly lowered. It is more desirable for the mixing amount of the dissolution inhibiting agent to fall in general between 10% by weight and 30% by weight.

The photosensitive composition according to another embodiment of the present invention is prepared by dissolving in a solvent a compound generating an ion-exchange group under the action of an acid and a compound generating an acid upon irradiation with actinic radiation, followed by filtering the resultant solution. The solvent includes, for example, ketone-based solvents such as acetone, cyclohexanone, methyl ethyl ketone, and methyl isobutyl ketone; cellosolve-based solvents such as methyl cellosolve acetate, ethyl cellosolve acetate, and butyl cellosolve acetate; and ester-based solvents such as ethyl acetate, butyl acetate, isoamyl acetate, □-butyl lactone, and methyl 3-methoxy propionate. It is also possible to use, for example, dimethyl sulfoxide, dimethyl formaldehyde and N-methyl pyrrolidinone depending on the photosensitive composition used for further improving the solubility.

It is also possible to use a propionic acid derivative such as methyl propionate, lactic acid esters such as ethyl lactate, and propylene glycol monomethyl ether acetate, which have attracted attention in recent years as substitute solvents of low toxicity.

It is possible to use the solvents described above singly or in the form of a mixture of a plurality of these solvents. Also, it is possible for these solvents to contain a suitable amount of xylene, toluene and an aliphatic alcohol such as isopropyl alcohol.

It is possible for the photosensitive composition according to another embodiment of the present invention to contain a surface active agent used as a film quality modifying agent, a bonding strength promoting agent, a basic substance, epoxy resin, polymethyl methacrylate, polymethyl acrylate, propylene oxide-ethylene oxide copolymer, a polymer such as polystyrene and a dye acting as an antireflection agent.

As described above, used in this embodiment of the present invention is a photosensitive composition containing a photo acid generating agent and a compound generating an ion-exchange group in the presence of an acid, with the result that a de-protection reaction of the ion-exchange group with an acid is absolutely necessary. Therefore, the protective group is decomposed in some cases by utilizing a thermal reaction in the presence of the acid generated by the optical reaction, said acid acting as a catalyst. It is necessary for the temperature of the thermal reaction to be lower than the heat resistance temperature of the insulating body. Also, it is desirable for the temperature of the thermal reaction to be lower than the glass transition temperature in order to maintain the dimensional stability. For example, PTFE has a glass transition temperature of 100° C. to 130° C. Therefore, it is necessary for the temperature of the thermal reaction to be lower than the temperature noted above in the case of using a PTFE film. The protective group generating a de-protection reaction under low temperatures includes, for example, phenolic resins such as polyhydroxy styrene and novolak resin, which are protected by a trivalent carbon such as a t-butyl group or a t-butoxy carbonyl methyl group, and acrylic resins such as polymethacrylic acid and polyacrylic acid, which are protected by pyranyl such as tetrahydro pyranyl and lactone. These compounds are decomposed at about 100° C. in the presence of an acid and, thus, are effective in the case where the substrate is formed of a material having a low glass transition temperature such as PTFE, polystyrene, acrylic resin or a derivative thereof.

On the other hand, in the case of using polyimide, benzocyclobutene resin or a crosslinked 1,2-polybutadiene for forming the substrate, the heat-resistant temperature is not lower than 250° C. and reaches about 400° C. depending on the material. It follows that it is possible to use a protective group having a high decomposition temperature. As a result, it is possible to use a compound that is not subjected to a de-protection reaction under temperatures not lower than 140° C. even in the presence of an acid. For example, it is possible to use a copolymer having an acrylic resin such as t-butyl methacrylate protected by a t-butyl group. In this case, it is desirable to use a bulky compound such as camphor sulfonate as the photo acid generating agent, in which anions are generated by the optical reaction, because the diffusion length can be suppressed so as to improve the resolution.

Each step included in the manufacturing method of this embodiment of the present invention will now be described with reference to the accompanying drawings.

Step (1): In the first step, a photosensitive composition layer 2 containing both a compound generating an ion-exchange group upon exposure to light and acid generating agent is formed on a inner surface of micropores of an porous insulating body 1, as shown in FIG. 1A. The porous body 1 has numerous three-dimensional continuous micropores. The porous body 1 is still porous even after the formation of the photosensitive composition layer 2.

Figure 1B:
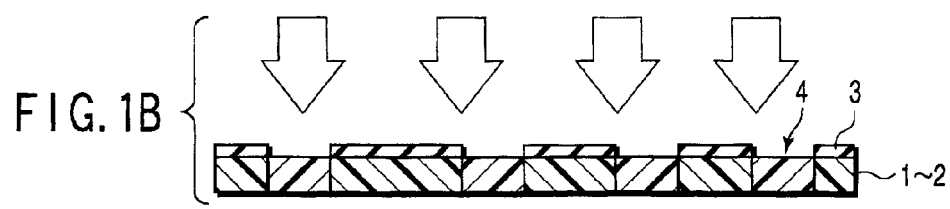

Step (2): In the next step, the porous insulating body covered with the photosensitive composition layer 2 formed on the inner surface of the micropores of the porous insulating body 1 is selectively exposed to light in a pattern by using a mask 3, as shown in FIG. 1B. As a result, an acid is generated from the photo acid generating agent with in a light-exposed portion 4.

Step (3): After the light exposure step, a heat treatment is applied. As a result, the protective group protecting the ion-exchange group in the exposed portion is decomposed under the catalytic function of the acid generated by the optical reaction so as to generate an ion-exchange group.

Figure 1C:

Step (4): Then, metal ions or metal is adsorbed on the ion-exchange group generated in the exposed portion 4 by the selective light exposure in a pattern carried out in step (3) above, as shown in FIG. 1C.

Figure 1D:
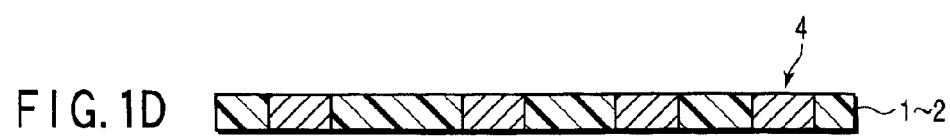

Step (5): The metal ions adsorbed on the ion-exchange groups in the exposed portion 4 are subjected to a reducing treatment, as required, so as to convert the metal ions into the elemental metal, as shown in FIG. 1D, thereby improving the catalytic activity and the conductivity.

Figure 1E:
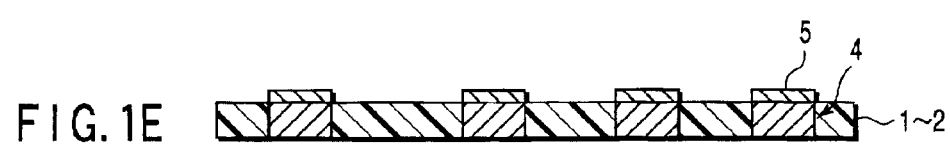

Step (6): Further, electroless plating is applied to the conductive portion formed in the exposed portion 4, as required, so as to improve the conductivity, as shown in FIG. 1E. The conductive material such as metal is deposited in the micropores of the exposed portion 4 during the electroless plating. Therefore, the interpenetrated structure of the conductive material and the insulating material is formed. The exposed portion 4 becomes conductive because the micropores of the porous insulating body 1 are three-dimensionary continuous. The electroless plating can also form the conductive layer 5 on the exposed portion 4.

The protective group is decomposed by the thermal reaction by using the acid generated from the photo acid generating agent upon exposure to light. It should be noted that, if the content of the ion-exchange groups that are to be generated is increased, the ion-exchange groups are eluted into the alkaline plating solution, resulting in the possibility that the metal is not precipitated. This phenomenon is prominent particularly when the ion-exchange group is acidic. In this case, it is possible to generate the ion-exchange group in the unexposed portion, if the heating is applied after elution of the exposed portion at the temperature at which the protective group is self-decomposed by the heat. It is possible to form a negative metal pattern, in which the metal is precipitated in the unexposed portion, it the plating is performed by allowing metal ions, a metal compound or a metal colloid to be adsorbed on the ion-exchange group. In this case, it is possible to carry out the two thermal reactions in a single process.

In steps (1) to (4) as well as steps (5) and (6), as required, included in the manufacturing method of the composite member according to another embodiment of the present invention, it is unnecessary to employ troublesome treatments such as resist coating, etching and peeling of the resist. It follows that the manufacturing process can be simplified, compared with the conventional method of manufacturing a wiring board, in which a through-hole is formed by, for example, photolithography and a mechanical means. Also, if a porous body is used as an insulating body, it is unnecessary to employ the step of forming a conductive portion by applying selective plating or by loading a conductive paste, with the result that the operation can be performed easily.

It should also be noted that the photosensitive composition according to another embodiment of the present invention exhibits a high stability in the unexposed portion, with the result that the substrate dipped in and coated with the photosensitive composition can be stored over a long time. It follows that no substantial problem is generated even if the manufacturing site where the photosensitive substance is handled differs from the manufacturing site where the plating is handled. In other words, it is possible to deliver the substrate dipped in and coated with the photosensitive composition in the form of an article and to apply simply the plating in a pattern in the site where the plating is handled.

What should also be noted is that it is possible to increase the accuracy of the pattern shape of the conductive portion so as to make it possible to form easily a fine pattern controlled to scores of microns or less. It follows that it is possible to increase the degree of freedom in the design of the conductive portion formed in the insulating body.

In the manufacturing method of the wiring board disclosed in Japanese Patent Disclosure (Kokai) No. 11-246977 referred to previously, it is necessary to form in advance a photosensitive composition layer containing a metal salt on the entire surface of the insulating body. However, such a step is not required in the method according to another embodiment of the present invention and, thus, the phenomenon that metal nuclei are precipitated in the undesired portion does not take place. As a result, it is possible to form a conductive portion having a fine pattern shape in the desired portion alone.

In another embodiment of the present invention, the reaction for removing the protective group is carried out separately from the optical reaction so as to make it possible to use a light beam having a long wavelength as the light for the light exposure. As a result, the damage done to the insulating body by the light exposure is lowered so as to suppress the deterioration of the insulating body. It is also possible to avoid the use of light having a wavelength that is greatly absorbed by the insulating body so as to suppress the absorption of the light for the light exposure. This is advantageous in forming a conductive portion extending through the porous body in the thickness direction of the porous body. Particularly, in using the porous body for forming a wiring board, it is necessary to use a heat-resistant polymer in the case where the polymer is used as the insulating material. It should be noted that many of the heat-resistant polymers are constructed such that an aromatic ring such as a benzene ring or a heterocyclic ring is attached to the backbone chain or the side chain of the polymer. What should be noted is that the structure of the aromatic ring or the heterocyclic ring absorbs the light in the ultraviolet region. For example, the benzene ring has an absorption peak in the vicinity of 254 nm, with the result that the light having a short wavelength not longer than 280 nm is absorbed substantially completely. It follows that it is difficult to apply the light exposure to the insulating body in a manner to extend through the insulating body in the thickness direction of the insulating body. Also, polyimide absorbs light having a wavelength not longer than 500 nm, with the result that it is impossible to form a pattern extending through the insulating layer in the thickness direction by the light exposure using an ultraviolet light.

It is possible to form a conductive portion having a fine pattern with a higher accuracy by using a light having a long wavelength, which is less absorbed by the structure of the aromatic and heterocyclic system, as the light for the light exposure.

It is desirable to use as a compound generating an ion-exchange group a high molecular weight compound having at least one of a sulfonium ester group, a carboxylic acid ester group and a phenol derivative group. These compounds are widely used for the general purposes and easily form ion-exchange groups upon irradiation with light. As a result, it is possible to form a conductive portion having a fine pattern with a high accuracy. Further, it is possible to coat any insulating body such as a ceramic insulating body or an organic insulating body with the group of the compounds described above. It follows that it is possible to use an insulating body low in cost and rich in workability.

In the method using PTFE, which is disclosed in Japanese Patent Disclosure (Kokai) No. 7-207450 referred to previously, a liquid such as water or alcohol is used as a compound having a hydrophilic group, and it is necessary to carry out the light exposure with a porous film wetted with the liquid noted above. As a result, a problem is generated that the manufacturing process and the light exposure apparatus are rendered complex. In the method according to another embodiment of the present invention, however, such a problem is not generated so as to make it possible to form easily a conductive portion.

Figure 2:
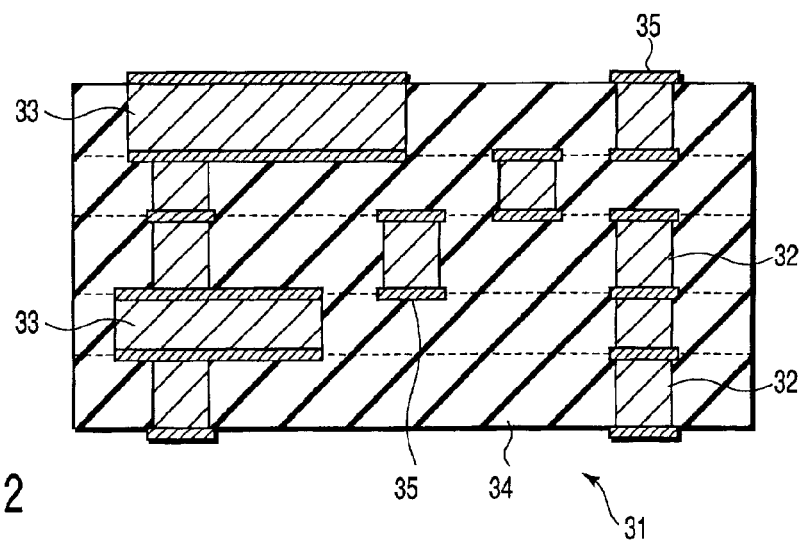
FIG. 2 is a cross-sectional view schematically showing the construction of a multi-layered wiring board including a composite member manufactured by the method according to one embodiment of the present invention.

FIG. 2 schematically shows as an example a multi-layered wiring board using a composite substrate manufactured by the method according to an example of the present invention. As shown in FIG. 2, a multi-layered wiring board 31 is prepared by laminating a plurality of porous films each consisting of an insulating body 34 provided with conductive portions such as vias 32 and wiring 33. The via 32 and the wiring 33 are formed by loading the inner surface or inside the fine pores of the porous film with a metal. A conductive portion 35 made of a conductive substance alone such as a metal is formed on the edge surface of the conductive portion.

To be more specific, in the multi-layered wiring board 31 shown in FIG. 2, the layer 35 made of a conductor that does not contain an insulating component is present on the uppermost surface of the conductive portions 32, 33 formed in the individual porous film, with the result that it is possible to lower the resistance of the conductive portion. Particularly, in the high-frequency region, the impedance characteristics can be improved by the skin effect of these structures.

The composite member manufactured by the method according to an example of the present invention can be used as a wiring board of a single layer without laminating a plurality of layers. Also, it is possible to obtain an electronic package by electrically connecting an electronic part to such wiring board or the multi-layered wiring board of the construction described above.

The present invention will now be described in more detail with reference to Examples. Needless to say, the present invention is not limited to these Examples.

EXAMPLE I-1

In the first step, a photosensitive composition was dissolved in a mixed solvent consisting of 1% by weight of cyclohexanone and toluene so as to prepare a mixed solution. The photosensitive composition used for preparing the mixed solution contained a photosensitive compound of a polyfunctional peroxide ester, i.e., 3,3',4,4'-tetra-(tert-butyl peroxy carbonyl)benzophenone (manufactured by Nippon Yushi K.K. under the trade name of BTTB), a crosslinkable polymer capable of a radical reaction, i.e., copolymer between polyvinyl ethylene PVE and polymethyl methacrylate PMMA (PVE:PMMA=1:3), and a coloring matter sensitive to a visible light of 3,3'-carbonyl bis(7-diethylamino cumarin) (manufactured by Hayashihara Biochemical Research Laboratory under the trade name of NKX-653). The weight ratio of the photosensitive compound, the crosslinkable polymer and the coloring matter contained in the photosensitive composition was 10:10:1.

On the other hand, prepared was a PTFE porous sheet having an average pore diameter of 0.1 $\mu$m and a film thickness of 20 $\mu$m, which was subjected to a hydrophilic treatment, was prepared as an insulating body, and the entire surface of the porous sheet was coated with the mixed solution by a dipping method. Further, the coating was dried at room temperature for 30 minutes so as to cover the surfaces of the pores of the porous sheet with a photosensitive composition layer.

The porous sheet having the photosensitive composition layer formed therein was exposed to light by using a laser depicting apparatus including an argon ion laser as a light source so as to form a stripe pattern having a line width of 20 $\mu$m and a space of 30 $\mu$m under the condition that the dose of light was 100 mJ/cm$^2$ (wavelength of 488 nm). As a result, a carboxylic acid was formed in the light exposed portion so as to form a latent image of a pattern.

The PTFE porous sheet having the latent image of a pattern formed therein was dipped for 30 minutes in a 0.01M aqueous solution of boron sodium hydride, followed by dipping the PTFE porous sheet in an aqueous solution of copper sulfate adjusted at 0.5M. Then, the washing with a distilled water was repeatedly performed three times. Further, the PTFE porous sheet was dipped for 30 minutes in a 0.01M aqueous solution of boron sodium hydride, followed by washing the PTFE porous sheet with a distilled water. Further, the sheet after the washing was dipped for 3 hours in an electroless copper plating solution PS-503 at 25° C. so as to apply a copper plating, thereby manufacturing a composite member.

A Cu wiring pattern having a line width of 20 $\mu$m and a space of 30 $\mu$m as in the mask used was formed in the resultant composite member. Naturally, the composite member thus prepared can be used as a wiring sheet.

Also, a composite member was prepared by applying a plating by the procedure described above, except that used was a mask having a pattern of vias each having a diameter of 50 $\mu$m. Vias extending through the PTFE porous sheet in the thickness direction of the sheet were formed in the resultant sheet of the composite member. The sheet of the composite member thus formed can be used as a wiring sheet (via sheet).

Further, prepared was a composite member that can be used as a wiring sheet and a via sheet by the procedure described above, except that used was a porous PTFE sheet having an average pore diameter of 0.5 $\mu$m and a sheet thickness of 20 $\mu$m. Defective plating caused by the peeling of the photosensitive composition was not recognized in the resultant wiring sheet and the via sheet. The wiring sheet and the via sheet thus formed were found to have good patterns of the wiring and the vias.

A multi-layered wiring board was prepared by using these wiring sheets and via sheets. In the first step, a core was prepared by alternately laminating four wiring sheets each having an average pore diameter of 0.5 $\mu$m and three via sheets each having an average pore diameter of 0.5 $\mu$m. Further, a wiring sheet and a via sheet each having an average pore diameter of 0.1 $\mu$m were laminated on both surfaces of the core. Then, the resultant structure was impregnated with a liquid resin system prepared by adding 5 parts by weight of dicumyl peroxide to 100 parts by weight of 1,2-polybutadiene having a molecular weight of 8,000. Finally, the impregnated structure was heated at 170° C. for one hour while applying pressure to the impregnated structure so as to cure the resin and, thus, to obtain a multi-layered wiring board.

EXAMPLE I-2

Prepared as an insulating body was a unwoven fabric made of glass fibers each having a diameter of 5 $\mu$m, having pores each having a diameter of 1 $\mu$m to 10 $\mu$m formed therein, and having a thickness of 50 $\mu$m.

Prepared was a composite member having a pattern of vias each having a diameter of 200 $\mu$m by using a photosensitive composition equal to that used in Example I-1 described above and by the procedure similar to that of Example I-1. Also prepared were wiring sheets and via sheets by using PTFE porous sheets each having an average pore diameter of 0.5 $\mu$m and a thickness of 20 $\mu$m by the procedure equal to that described previously.

Further, a multi-layered wiring board was prepared by using the resultant wiring sheets and via sheets. In the first step, a laminate structure was prepared by wrapping two wiring sheets each having an average pore diameter of 0.5 $\mu$m in a single via sheet, and the laminate structure thus prepared was arranged on both surfaces of the glass fiber sheet prepared previously, followed by impregnating the laminate structure with a resin solution prepared by adding 50 parts by weight of methyl isobutyl ketone to 100 parts by weight of benzocyclobutene manufactured by Dow Chemical Inc. Further, after the solvent was removed by drying with a hot air stream, the resin was cured by the heating at 240° C. for one hour under a nitrogen gas stream so as to prepare a multi-layered wiring board.

The multi-layered wiring board thus prepared was found to exhibit a sufficiently high bending strength because a layer of the glass fibers was laminated in the multi-layered wiring board.

EXAMPLE I-3

Prepared as an insulating body was an unwoven fabric made of PPS fibers each having a diameter of about 1 to 2 μm, which were prepared by a melt-blow method.

A composite member having a pattern of vias each having a diameter of 200 μm was prepared by using a photosensitive composition equal to that used in Example I-1 described previously and by the procedure equal to that employed in Example I-1.

EXAMPLE I-4

A radical polymerization was performed between tetrahydropyranyl methacrylate and methyl acrylate by using azobisisobutyronitrile (AIBN) as an initiating agent so as to obtain a copolymer. The copolymer thus obtained was found to have a weight average molecular weight Mw of 35,000, and the rate of introduction of the tetrahydropyranyl groups into the copolymer was found to be 33%.

Then, prepared was an acetone solution of a photosensitive composition comprising 20 parts by weight of the copolymer noted above, 5 parts by weight of a crosslinkable compound, which is a tetrafunctional acrylic acid ester derivative having a chemical structure represented by the chemical formula (A) given below, 2 parts by weight of a triazine-based acid generating agent of a radical generation type used as a photo acid generating agent, i.e., 2-[2-(4-diethylamino-2-methyl phenyl)ethenyl]-4,6-bis(trichloromethyl)-s-triazine, and 1 part by weight of 3,3'-carbonyl bis(7-diethylamino cumarin) used as a visible light photosensitizer:

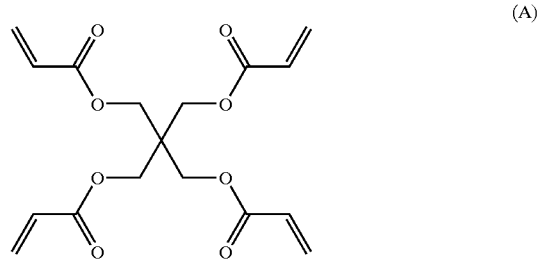

(A)

Prepared as an insulating body was a PTFE porous sheet having an average pore diameter of 0.2 μm and a thickness of 40 μm and subjected to a hydrophilic treatment. The entire surface of the porous sheet was coated with the solution noted above by a dipping method. Further, the surfaces within the pores were covered with the photosensitive composition layers by drying at room temperature for 30 minutes.

The porous sheet having the photosensitive composition layer formed therein was exposed to light by using a laser depicting apparatus including an argon ion laser as a light source so as to form a stripe pattern having a line width of 20 μm and a space of 30 μm under the condition that the dose of light was 300 mJ/cm² (wavelength of 488 nm). After the light exposure, heating was applied at 110° C. for 30 minutes. As a result, a carboxylic acid was formed in the light exposed portion so as to form a latent image of a pattern.

The PTFE porous sheet having the latent image of a pattern formed therein was processed as in Example I-1 so as to apply a copper plating, thereby manufacturing a composite member.

A Cu wiring pattern having a line width of 20 μm and a space of 30 μm as in the mask used was formed in the resultant composite member. Naturally, the composite member thus prepared can be used as a wiring sheet.

EXAMPLE I-5

Used as a photosensitive polymer was a cresol novolak resin having a t-butoxy carbonyl methyloxy group and a methacryloyloxy group introduced therein by introducing a t-butoxy carbonyl methyl group acting as a photosensitive group and a methacryloyl group acting as a crosslinkable group into the portion of the phenolic hydroxyl group. The photosensitive polymer had a weight average molecular weight Mw of 4,600. The rate of introduction of the photosensitive group was 62%, and the rate of introduction of the crosslinkable group was 15%. Then, the photosensitive polymer was mixed with 2-[2-(4-diethylamino-2-methyl phenyl)ethenyl]-4,6-bis(trichloromethyl)-s-triazine, which is a triazine-based acid generating agent of a radical generation type so as to obtain a photosensitive composition. The mixing ratio of the photosensitive polymer to the acid generating agent was 10:1 by weight. Further, prepared was an acetone solution containing 1% by weight of the photosensitive composition.

Prepared as an insulating body was a PTFE porous sheet having an average pore diameter of 0.2 μm and a thickness of 40 μm and subjected to a hydrophilic treatment. The entire surface of the porous sheet was coated with the solution noted above by a dipping method. Further, the surfaces within the pores were covered with photosensitive composition layers by drying at room temperature for 30 minutes.

The porous sheet having the photosensitive composition layer formed therein was exposed to light by using a laser depicting apparatus including an argon ion laser as a light source so as to form a stripe pattern having a line width of 20 μm and a space of 30 μm under the condition that the dose of light was 300 mJ/cm² (wavelength of 488 nm). After the light exposure, heating was applied at 150° C. for 30 minutes. As a result, a carboxylic acid was formed in the light exposed portion so as to form a latent image of a pattern.

The PTFE porous sheet having the latent image of a pattern formed therein was processed as in Example I-1 so as to apply copper plating, thereby manufacturing a composite member. A Cu wiring pattern having a line width of 20 μm and a space of 30 μm as in the mask used was formed in the resultant composite member. Naturally, the composite member thus prepared can be used as a wiring sheet.

EXAMPLE I-6

Used as a photosensitive polymer was a cresol novolak resin having an o-naphthoquinone diazide sulfonic acid ester group acting as a photosensitive group and an acryloyl group acting as a crosslinked group introduced into the portion of the phenolic hydroxyl group. The rate of introduction of the photosensitive group into the photosensitive polymer was 36% and the rate of introduction of the crosslinkable group into the photosensitive polymer was 21%. BTTB used as a radical generating agent was mixed with the photosensitive polymer such that the weight ratio of the photosensitive polymer to the radical generating agent was 10:1 so as to prepare a photosensitive composition. Further, prepared was an acetone solution containing 1% by weight of the photosensitive composition.

Prepared as an insulating body was a polyimide porous sheet having an average pore diameter of 0.5 μm and a thickness of 20 μm and subjected to a hydrophilic treatment. For preparing the polyimide porous sheet, a glass plate was coated with an N,N-dimethyl acetamide solution containing 16% by weight of polyamic acid, followed by immediately dipping the coated glass plate in methanol so as to render the coated layer porous by the spinodal decomposition. Further, the solvent was removed and a heat treatment was applied at 350° C. under a nitrogen atmosphere so as to convert the polyamic acid into imide, thereby preparing the polyimide porous sheet. Th polyamic acid solution was prepared by the reaction between equivalent amounts of 3,3',4,4'-benzophenone tetracarboxylic acid dianhydride and 2,2'-bis[4-(p-amino phenoxy)phenyl]propane, which was carried within N,N-dimethyl acetamide.

The entire surface of the polyimide porous sheet thus prepared was coated with the solution noted above by a dipping method. Also, the polyimide porous sheet coated with the solution of the photosensitive composition was dried for 30 minutes at room temperature so as to cover the surfaces within the pores with a photosensitive composition layer.

The porous sheet having the photosensitive composition layer formed therein was exposed to light by using a CANON PLA501, which is a parallel light exposure device, through a mask of a wiring pattern having a line width of 20 μm and a space of 30 μm under the condition that the dose of light was 1 J/cm². As a result, a carboxylic acid was formed in the light exposed portion so as to form a latent image of a pattern.

The PTFE porous sheet having the latent image of a pattern formed therein was processed as in Example I-1 so as to apply a copper plating, thereby manufacturing a composite member. A Cu wiring pattern having a line width of 20 μm and a space of 30 μm as in the mask used was formed in the resultant composite member. Naturally, the composite member thus prepared can be used as a wiring sheet.

EXAMPLE I-7

Prepared was a methoxy methyl propionate solution of a photosensitive composition comprising 250 parts by weight of a polymer capable of decarboxylation, which is represented by chemical formula (B) given below, 5 parts by weight of naphthyl imidyl trifluoromethane sulfonate used as a photo acid generating agent, 2 parts by weight of cyclohexyl amine, 20 parts by weight of the crosslinkable compound equal to that used in Example I-4 and 1 part by weight of dicumyl peroxide:

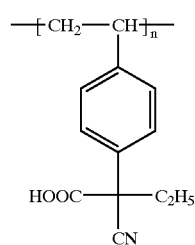

(B)

Prepared as an insulating body was a PTFE porous film having a pore diameter of 0.5 μm and a thickness of 20 μm, followed by coating the entire surface of the porous film with the solution noted above by a dipping method. Further, a heat treatment was applied at 100° C. for 90 seconds so as to form a photosensitive composition layer.

The porous sheet having the photosensitive composition layer formed therein was exposed to light by using a CANON PLA501 parallel light exposure apparatus through a mask having an L/S of 50 μm/100 μm. Then, a heat treatment was applied for 15 minutes at 140° C., followed by applying the procedure equal to that employed in Example I-1 so as to achieve a copper plating. Obtained was a composite member having a conductive portion having an L/S of 50 μm/100 μm formed over the inner region.

EXAMPLE I-8

A radical polymerization was carried out between tetrahydropyranyl methacrylate and a methacrylate $T_8$ steric monomer represented by chemical formula (C) given below by using azobisisobutyronitrile (AIBN) as an initiating agent so as to obtain a copolymer:

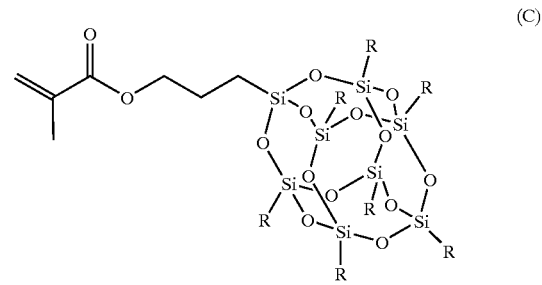

(C)

where R represents a cyclohexyl group.

The copolymer thus prepared was found to have a weight average molecular weight Mw of 120,000. The rate of introduction of the tetrahydropyranyl group into the copolymer was 37%. Then, a solution of a photosensitive composition was prepared by mixing 20 parts by weight of the copolymer thus obtained with 2 parts by weight of naphthyl imidyl trifluoromethane sulfonate.

Prepared as an insulating body was a PTFE porous film having a pore diameter of 0.2 μm and a thickness of 20 μm, followed by coating the entire surface of the porous film with the solution noted above by a dipping method. Further, the porous sheet was dried at room temperature for 30 minutes so as to cover the surfaces within the pores with a photosensitive composition layer.

The porous sheet having the photosensitive composition layer formed therein was exposed to light by using a CANON PLA501 parallel light exposure apparatus through a mask of a wiring pattern having a line width of 20 μm and a space of 30 μm under the condition that the dose of light was 1 J/cm². Then, a heat treatment was applied for 30 minutes at 110° C., with the result that a carboxylic acid was formed in the exposed portion so as to form a pattern of a latent image.

The PTFE porous sheet having the latent image of a pattern formed therein was processed as in Example I-1 so as to apply a copper plating, thereby manufacturing a composite member. A Cu wiring pattern having a line width of 20 μm and a space of 30 μm as in the mask used was formed in the resultant composite member. Naturally, the composite member thus prepared can be used as a wiring sheet.

EXAMPLE I-9

A radical polymerization was carried out between tetrahydropyranyl methacrylate and norbornene by using azobisisobutyronitrile as an initiating agent so as to obtain a copolymer. The copolymer thus obtained was found to have a weight average molecular weight Mw of 3,200. The rate of introduction of the tetrahydropyranyl groups was 34%. Further, a solution of a photosensitive composition was prepared by mixing 20 parts by weight of the copolymer thus prepared, 2 parts by weight of 2-[2-(4-diethylamino-2-methyl phenyl)ethenyl]-4,6-bis(trichloromethyl)-s-triazine used as a triazine-based acid generating agent of a radical generation type, and 1 part by 3,3',4,4'-tetra-(tert-butyl peroxy carbonyl)benzophenone having a trade name of BTTB and manufactured by Nippon Yushi K.K.

Prepared as an insulating body was a PTFE porous sheet having an average pore diameter of 0.1 μm and a thickness of 20 μm, followed by coating the entire surface of the porous film with the solution noted above by a dipping method. Further, the porous sheet was dried at room temperature for 30 minutes so as to cover the surfaces within the pores with a photosensitive composition layer.

The porous sheet having the photosensitive composition layer formed therein was exposed to light by using a CANON PLA501 parallel light exposure apparatus through a mask of a wiring pattern having a line width of 4 μm and a space of 30 μm. The light exposure was performed under the condition that the light dose was set at 1 J/cm². Then, a heat treatment was applied for 30 minutes at 110° C., with the result that a carboxylic acid was formed in the exposed portion so as to form a pattern of a latent image.

The PTFE porous sheet having the latent image of a pattern formed therein was processed as in Example I-1 so as to apply a copper plating, thereby manufacturing a composite member. A Cu wiring pattern having a line width of 10 μm and a space of 30 μm as in the mask used was formed in the resultant composite member. Naturally, the composite member thus prepared can be used as a wiring sheet.

COMPARATIVE EXAMPLE I-1

A photosensitive composition was prepared as in Example I-4, except that a crosslinkable compound was not added to the composition.

It was attempted to prepare a copper plating pattern as in Example I-4 by using the photosensitive composition noted above. It was certainly possible to form a pattern of the copper plating. However, the pattern of the copper plating was found to have been partly broken, which was considered to have been caused by the peeling of the photosensitive composition layer.

COMPARATIVE EXAMPLE I-2

A photosensitive composition was prepared as in Example I-5, except that a cresol novolak resin having 62% of photosensitive groups, which did not have crosslinkable groups, introduced therein was used as a photosensitive polymer.

It was attempted to prepare a copper plating pattern as in Example I-5 by using the photosensitive composition noted above. It was certainly possible to form a pattern of the copper plating. However, the pattern of the copper plating was found to have been partly broken, which was considered to have been caused by the peeling of the photosensitive composition layer.

COMPARATIVE EXAMPLE I-3

A photosensitive composition was prepared as in Example I-6, except that a cresol novolak resin having 36% of photosensitive groups, which did not have crosslinkable groups, introduced therein was used as a photosensitive polymer.

It was attempted to prepare a copper plating pattern as in Example I-6 by using the photosensitive composition noted above. It was certainly possible to form a pattern of the copper plating. However, the pattern of the copper plating was found to have been partly broken, which was considered to have been caused by the peeling of the photosensitive composition layer.

Comparative Example I-4

A photosensitive composition was prepared as in Example I-9, except that naphthyl imidyl trifluoromethane sulfonate was used as an acid generating agent in place the triazine-based acid generating agent, and that BTTB was not added to the photosensitive composition.

It was attempted to prepare a copper plating pattern as in Example I-9 by using the photosensitive composition noted above. It was certainly possible to form a pattern of the copper plating. However, the pattern of the copper plating was found to have been partly broken, which was considered to have been caused by the peeling of the photosensitive composition layer.

EXAMPLE II

Prior to the preparation of a composite member, high molecular weight compounds mixed in the photosensitive compositions of this Example were synthesized by a radical polymerization method using AIBN as an initiating agent. These high molecular weight compounds were random copolymers. Tables 1 to 6 show the molar ratios of the monomer units of the random copolymer.

TABLE 1

| Sample | t-butyl methacrylate (mol) | Styrene (mol) |
| --- | --- | --- |
| A30 | 30 | 70 |
| A50 | 50 | 50 |
| A70 | 70 | 30 |

In these copolymers, t-butyl methacrylate forms the first repetition unit having an ion-exchange group, and styrene forms the second repetition unit having an atomic group that is not decomposed by an acid and is insoluble in an alkali. Also, a carboxyl group forms the ion-exchange group, and t-butyl group is introduced as a protective group into the carboxyl group.

TABLE 2

| Sample | t-butyl methacrylate (mol) | Methyl methacrylate (mol) |
| --- | --- | --- |
| B30 | 30 | 70 |
| B50 | 50 | 50 |
| B70 | 70 | 30 |

In these copolymers, t-butyl methacrylate forms the first repetition unit having an ion-exchange group, and methyl methacrylate forms the second repetition unit having an atomic group that is not decomposed by an acid and is insoluble in an alkali. Also, a carboxyl group forms the ion-exchange group, and a t-butyl group is introduced as a protective group into the carboxyl group.

TABLE 3

| Sample | Tetrahydropyranyl methacrylate (mol) | Styrene (mol) |
|---|---|---|
| C30 | 30 | 70 |
| C50 | 50 | 50 |
| C70 | 70 | 30 |

In these copolymers, tetrahydropyranyl methacrylate forms the first repetition unit having an ion-exchange group, and styrene forms the second repetition unit having an atomic group that is not decomposed by an acid and is insoluble in an alkali. Also, a carboxyl group forms the ion-exchange group, and a tetrahydropyranyl group is introduced as a protective group into the carboxyl group.

TABLE 4

| Sample | Tetrahydropyranyl methacrylate (mol) | Methyl methacrylate (mol) |
|---|---|---|
| D10 | 10 | 90 |
| D20 | 20 | 80 |
| D25 | 25 | 75 |
| D30 | 30 | 70 |
| D35 | 35 | 65 |
| D40 | 40 | 60 |
| D50 | 50 | 50 |
| D70 | 70 | 30 |

In these copolymers, tetrahydropyranyl methacrylate forms the first repetition unit having an ion-exchange group, and methyl methacrylate forms the second repetition unit having an atomic group that is not decomposed by an acid and is insoluble in an alkali. Also, a carboxyl group forms the ion-exchange group, and a tetrahydropyranyl group is introduced as a protective group into the carboxyl group.

The molecular weight (Mw) by the GCP measurement of the high molecular weight compounds (copolymers) given above was about 40,000.

TABLE 5

| Sample | t-butoxy carbonyl methoxy styrene (mol) | Hydroxy styrene (mol) |
|---|---|---|
| E10 | 10 | 90 |
| E20 | 20 | 80 |
| E30 | 30 | 70 |
| E40 | 40 | 60 |

In these copolymers, t-butoxy carbonyl methoxy styrene forms the first repetition unit having an ion-exchange group. Hydroxy styrene is not decomposed by an acid, but is soluble in an alkaline solution. Also, a carboxyl group forms the ion-exchange group, and a t-butyl group or a t-butoxy carbonyl methyl group is introduced as a protective group into the carboxyl group.

The molecular weight (Mw) by the GCP measurement of the high molecular weight compounds (copolymers) given above was about 10,000.

TABLE 6

| Sample | t-butoxy carbonyl methoxy styrene (mol) | Styrene (mol) |
|---|---|---|
| F10 | 10 | 90 |
| F20 | 20 | 80 |
| F30 | 30 | 70 |
| F40 | 40 | 60 |

In these copolymers, t-butoxy carbonyl methoxy styrene forms the first repetition unit having an ion-exchange group, and styrene forms the second repetition unit having an atomic group that is not decomposed by an acid and is insoluble in an alkali. Also, a carboxyl group of a carbonyl methoxy group forms the ion-exchange group, and a t-butyl group is introduced as a protective group into the carboxyl group.

A pattern was formed on an insulating body by the method of this Example by using the random copolymers thus obtained.

EXAMPLE II-1

Formation of Wiring Pattern on Porous Insulating Body

Naphtyl imide trifluoromethane sulfonate was added as a photo acid generating agent to each of the high molecular weight compounds in an amount of 1 part by weight. Then, the high molecular weight compound and the photo acid generating agent were dissolved in acetone so as to prepare an acetone solution containing 1 part by weight of the sum of the solid components of the high molecular weight compound and the photo acid generating agent, thereby preparing a photosensitive composition.

Used as an insulating body was a PTFE porous film having a pore diameter of 500 nm and a thickness of 20 $\mu$m, and the entire surface of the porous film was coated with the photosensitive composition. By this operation, the surfaces of the porous film including the surfaces of the pores inside the porous film were covered with the photosensitive composition.

Then, the porous sheet was exposed to light having a wavelength of 436 nm through a mask having various patterns having a line width of 3 $\mu$m to 100 $\mu$m and a dot diameter of 3 $\mu$m to 100 $\mu$m by using a CANON PLA501 so as to form a latent image. Further, the porous sheet was heated on a hotplate at 90° C. for 5 minutes so as to promote the de-protection reaction, thereby selectively generating ion-exchange groups on the light exposed portion.

The sheet having a latent image of the pattern was dipped for 5 minutes in an aqueous solution of copper sulfate adjusted at 0.5M, followed by washing the sheet three times with distilled water. Further, the sheet was dipped for 30 minutes in a 0.01M aqueous solution of boron sodium hydride, followed by washing the sheet with distilled water so as to prepare a composite member. A conductive portion made of Cu was formed in the composite member thus prepared.

Further, the sheet having a conductive pattern formed therein was dipped for 30 minutes in an electroless copper plating solution PS-503 so as to apply copper plating, thereby forming a wiring pattern.

Tables 7 and 8 show the high molecular weight compounds used and the minimum sizes of the extending dot patterns (vias) and the line patterns (wiring).

TABLE 7

| Sample | Dot ($\mu$m) | Line ($\mu$m) |
|---|---|---|
| A30 | X | X |
| A50 | X | X |
| A70 | X | X |
| B30 | X | X |
| B50 | X | X |
| B70 | X | X |
| C30 | 40 | 50 |
| C50 | X | X |
| C70 | X | X |
| D10 | X | X |
| D20 | 50 | 50 |
| D25 | 30 | 40 |
| D30 | 20 | 20 |
| D35 | 14 | 16 |
| D40 | 16 | 20 |
| D50 | 20 | 30 |
| D70 | X | X |

TABLE 8

| Sample | Dot ($\mu$m) | Line ($\mu$m) |
|---|---|---|
| E10 | X | X |
| E20 | 60 | 80 |
| E30 | X | X |
| E40 | X | X |
| F10 | 60 | 80 |
| F20 | 40 | 50 |
| F30 | 25 | 30 |
| F40 | 30 | 50 |

In the case of using samples A30, A50, A70, B30, B50 and B70, the latent image of the pattern was visually recognized between the light exposure and PEB. However, adsorption of the plating did not take place. Also, elution of the photosensitive composition into the alkaline plating solution did not take place. It is considered reasonable to understand that these situations were brought about because the protective group was not sufficiently decomposed.

The plating pattern was resolved in sample C30 alone among samples C30, C50 and C70. In samples C50 and C70, the latent image of the pattern was visually recognized between the light exposure and PEB. However, adsorption of the plating did not take place. It is considered reasonable to understand that the particular situation was brought about because the photosensitive composition was dissolved in alkali.

A good plating pattern was resolved in each of the D-series samples. Among the D-series samples, the attached amount of plating was small for sample D10, resulting in failure to form a satisfactory pattern. Also, for sample D70, the photosensitive composition was found to have eluted completely, resulting in failure to form a pattern. Among the samples that formed patterns, samples D30 and D50 exhibited very good conductivity.

For the E-series samples, the photosensitive composition was found to have eluted completely, resulting in failure to form a pattern. Even in the case of sample E20 that permitted formation of a pattern, a current flow was not recognized in the conductivity test. On the other hand, the elution of the photosensitive composition did not take place in the F-series samples so as to make it possible to obtain a good plating pattern.

EXAMPLE II-2

A photosensitive composition was prepared as in Example II-1, except that triphenyl sulfonium.trifluoromethane sulfonate was used as a photo acid generating agent in place of naphthyl imide-trifluoromethane sulfonate and that D-series high molecular weight compounds were used.

An insulating body as in Example II-1 was coated with the resultant photosensitive composition, and the insulating body coated with the photosensitive composition was exposed to light at a dose of 120 mJ/cm$^2$ by using a low-pressure mercury lamp as the light source of the light exposure. Then, the insulating body was heated at 90° C. for 5 minutes on a hotplate so as to promote the de-protection reaction, thereby selectively generating ion-exchange groups on the light-exposed portion.

Further, a treatment similar to that in Example II-1 was applied so as to form a wiring pattern on the insulating body.

Measured were the minimum sizes of the dot patterns (vias) and the line patterns (wiring) formed on the surface of the PTFE porous film used as the insulating body. Also measured was the thickness in the depth direction of the formed dot pattern having a diameter of 50 $\mu$m. Table 9 shows the results together with the high molecular weight compounds used.

TABLE 9

| Sample | Dot ($\mu$m) | Line ($\mu$m) | Depth ($\mu$m) |
|---|---|---|---|
| D20 | 40 | 40 | 4 |
| D25 | 30 | 40 | 7 |
| D30 | 18 | 20 | 8 |
| D35 | 12 | 14 | 10 |
| D40 | 16 | 20 | 8 |
| D50 | 20 | 30 | 7 |
| D70 | X | X | X |

Triphenyl sulfonium.trifluoromethane sulfonate used in this Example as a photo acid generating agent is sensitized mainly to light having a wavelength not longer than 300 nm and, thus, is considered to have been sensitized to the light emitted from the low-pressure mercury lamp and having a wavelength of 252 nm. The transparency of PTFE is poor in respect of light having the wavelength noted above. Specifically, the absorbance of the PTFE layer having a thickness of 20 $\mu$m is about 2. As a result, the plating pattern was precipitated on only the surface exposed to the light.

Further, a photosensitive composition was prepared as above, except that diphenyl iodonium.trifluoromethane sulfonate was used as a photo acid generating agent. An insulating body similar to that described above was coated with the resultant photosensitive composition and, then, the insulating body was exposed to light at a dose of 120 mJ/cm$^2$ by using a low-pressure mercury lamp as the light source for the light exposure. Further, the insulating body was heated at 90° C. for 5 minutes on a hotplate so as to promote the de-protection reaction, thereby selectively forming ion-exchange groups on the light exposed portion.

Further, a treatment similar to that in Example II-1 was applied so as to form a wiring pattern on the insulating body.

Measured were the minimum sizes of the dot patterns (vias) and the line patterns (wiring) formed on the surface of the PTFE porous film used as the insulating body. Also measured was the thickness in the depth direction of the formed dot pattern having a diameter of 50 $\mu$m. Table 10 shows the results together with the high molecular weight compounds used.

TABLE 10

| Sample | Dot (μm) | Line (μm) | Depth (μm) |
|---|---|---|---|
| D20 | 50 | 50 | 4 |
| D25 | 35 | 40 | 7 |
| D30 | 18 | 20 | 8 |
| D35 | 14 | 16 | 10 |
| D40 | 16 | 20 | 8 |
| D50 | 25 | 30 | 7 |
| D70 | X | X | X |

Diphenyl iodonium.trifluoromethane sulfonate used in this Example as a photo acid generating agent is sensitized mainly to light having a wavelength not longer than 300 nm and, thus, is considered to have been sensitized to the light emitted from the low-pressure mercury lamp and having a wavelength of 252 nm. As a result, the plating pattern was precipitated on only the surface exposed to the light.

The technology described above can be employed in the case where it is necessary to form a wiring pattern on one surface alone.

EXAMPLE II-3

Formation of Inverted Pattern

Naphtyl imide.trifluoromethane sulfonate was added as a photo acid generating agent to each of the high molecular weight compounds in an amount of 1 part by weight. Then, the high molecular weight compound and the photo acid generating agent were dissolved in acetone so as to prepare an acetone solution containing 1 part by weight of the sum of the solid components of the high molecular weight compound and the photo acid generating agent, thereby preparing a photosensitive composition.

Used as an insulating body was a PTFE porous film having a pore diameter of 500 nm and a thickness of 20 μm, and the entire surface of the porous film was coated with the photosensitive composition by a dipping method. By this operation, the surfaces of the porous film including the surfaces of the pores inside the porous film were covered with the photosensitive composition.

Then, the porous sheet was exposed to light having a wavelength of 436 nm through a mask having various patterns having a line width of 3 μm to 100 μm and a dot diameter of 3 μm to 100 μm by using a CANON PLA501 so as to form a latent image. Further, the porous sheet was heated on a hotplate at 120° C. for 5 minutes so as to promote the de-protection reaction, thereby selectively generating ion-exchange groups on the light exposed portion.

The sheet having a latent image of the pattern formed thereon was dipped for 5 minutes in an aqueous solution of copper sulfate adjusted at 0.5M, followed by repeatedly washing three times the sheet with distilled water. Further, the sheet was dipped for 30 minutes in a 0.01M aqueous solution of boron sodium hydride, followed by washing the sheet with distilled water so as to prepare a composite member. A conductive portion made of Cu was formed in the composite member thus prepared.

Further, the sheet having a conductive pattern formed therein was dipped for 30 minutes in an electroless copper plating solution PS-503 so as to apply copper plating, thereby forming a wiring pattern.

In the wiring pattern thus prepared, a metal pattern was not precipitated on the light exposed portion, and a metal pattern was formed in the unexposed portion. Table 11 shows the result of the patterning.

TABLE 11

| Sample | Dot (μm) | Line (μm) |
|---|---|---|
| D20 | X | X |
| D25 | X | X |
| D30 | 40 | 50 |
| D35 | 45 | 40 |
| D40 | 40 | 40 |
| D50 | 60 | 50 |
| D70 | X | X |

In this Example, the decomposition rate of the protective group was controlled by controlling the baking temperature after the light exposure step. As a result, it was possible to form a plating pattern having the inverted positive-negative relationship.

EXAMPLE II-4

Formation of Wiring Pattern on Polyimide Film (1)

Naphtyl imide.trifluoromethane sulfonate was added as a photo acid generating agent to each of the high molecular weight compounds in an amount of 1 part by weight. Then, the high molecular weight compound and the photo acid generating agent were dissolved in acetone so as to prepare an acetone solution containing 1 part by weight of the sum of the solid components of the high molecular weight compound and the photo acid generating agent, thereby preparing a photosensitive composition.

Used as an insulating body was a "Yupirex" film (trade name of a polyimide porous film manufactured by Ube Kosan K.K. and having a pore diameter of 500 nm and a thickness of 20 μm). The porous polyimide film was sufficiently heated in a nitrogen gas atmosphere so as to prevent amines from remaining in the porous film. Then, an oxygen plasma treatment was applied to the porous film so as to enhance the hydrophilic properties of the porous film.

The entire surface of the porous film thus prepared was coated with the photosensitive composition by a dipping method. By this operation, the surfaces of the porous film including the surfaces of the pores inside the porous film were covered with the photosensitive composition.

Then, the porous sheet was exposed to light through a mask having various patterns having a line width of 3 μm to 100 μm and a dot diameter of 3 μm to 100 μm by using a CANON PLA501 so as to form a latent image. Light having a wavelength not longer than 550 nm was shielded by using a filter so as to use the visible light alone as the light for the light exposure. After formation of the latent image, the porous sheet was heated on a hotplate at 90° C. for 5 minutes so as to promote the de-protection reaction, thereby selectively generating ion-exchange groups on the light-exposed portion.

The sheet having a latent image of the pattern formed thereon was dipped for 5 minutes in an aqueous solution of copper sulfate adjusted at 0.5M, followed by washing the sheet three times with distilled water. Further, the sheet was dipped for 30 minutes in a 0.01M aqueous solution of boron sodium hydride, followed by washing the sheet with distilled water so as to prepare a composite member. A conductive portion made of Cu was formed in the composite member thus prepared.

Further, the sheet having a conductive pattern formed therein was dipped for 30 minutes in an electroless copper plating solution PS-503 so as to apply copper plating, thereby forming a wiring pattern. Table 12 shows the result of the patterning.

TABLE 12

| Sample | Dot ($\mu$m) | Line ($\mu$m) |
|---|---|---|
| D20 | X | X |
| D25 | X | X |
| D30 | 50 | 60 |
| D35 | 50 | 50 |
| D40 | 50 | 70 |
| D50 | 70 | 80 |
| D70 | X | X |

In the method of this Example, an acid generated from the photo acid generating agent is used as a catalyst. Therefore, in the case of using polyimide containing an amine, which is a basic substance, it is necessary to decrease the amine content as much as possible so as to prevent the deactivation of the acid.

EXAMPLE II-5

Formation of Wiring Pattern on Polyimide Film (2)

Naphtyl imide.camphor sulfonate was added as a photo acid generating agent to each of the high molecular weight compounds in an amount of 1 part by weight. Then, the high molecular weight compound, the photo acid generating agent, and a visible light photosensitizer were dissolved in acetone so as to prepare an acetone solution containing 1 part by weight of the sum of the solid components of the high molecular weight compound, the photo acid generating agent, and the visible light photosensitizer, thereby preparing a photosensitive composition.

Used as an insulating body was a "Yupirex" film (trade name of a polyimide porous film manufactured by Ube Kosan K.K. and having a pore diameter of 500 nm and a thickness of 20 $\mu$m). The porous polyimide film was sufficiently heated in a nitrogen gas atmosphere so as to prevent amines from remaining in the porous film. Then, an oxygen plasma treatment was applied to the porous film so as to enhance the hydrophilic properties of the porous film.

The entire surface of the porous film thus prepared was coated with the photosensitive composition by a dipping method. By this operation, the surfaces of the porous film including the surfaces of the pores inside the porous film were covered with the photosensitive composition.

Then, the porous sheet was exposed to light through a mask having various patterns having a line width of 3 $\mu$m to 100 $\mu$m and a dot diameter of 3 $\mu$m to 100 $\mu$m by using a CANON PLA501 so as to form a latent image. Light having a wavelength not longer than 550 nm was shielded by using a filter so as to use the visible light alone as the light for the light exposure. After formation of the latent image, the porous sheet was heated on a hotplate at 150° C. for 5 minutes so as to promote the de-protection reaction, thereby selectively generating ion-exchange groups on the light-exposed portion.

The sheet having a latent image of the pattern formed thereon was dipped for 5 minutes in an aqueous solution of copper sulfate adjusted at 0.5M, followed by washing the sheet three times with distilled water. Further, the sheet was dipped for 30 minutes in a 0.01M aqueous solution of boron sodium hydride, followed by washing the sheet with distilled water so as to prepare a composite member. A conductive portion made of Cu was formed in the composite member thus prepared.

Further, the sheet having a conductive pattern formed therein was dipped for 30 minutes in an electroless copper plating solution PS-503 so as to apply copper plating, thereby forming a wiring pattern. Table 13 shows the result of the patterning.

TABLE 13

| Sample | Dot ($\mu$m) | Line ($\mu$m) |
|---|---|---|
| A20 | 35 | 50 |
| A50 | 70 | 80 |
| A70 | X | X |
| B20 | 30 | 40 |
| B50 | 50 | 60 |
| B70 | X | X |

Since polyimide has a high heat resistance, it is possible to use t-butyl methacrylate having a high decomposition temperature not lower than 140° C. as a protective group. In order to apply a post-exposure baking at a high temperature of 150° C., it is necessary to use an acid generated from the photo acid generating agent and having a short diffusion length. Therefore, used in this Example was naphthyl imide.camphor sulfonate having a bulky anion. As a result, it was possible to form a fine plating pattern on the polyimide porous film.

EXAMPLE II-6

Visible Light Photosensitizer

A photosensitive composition was prepared as in Example II-1, except that a photosensitizer BC manufactured by Midori Kagaku K.K. was added at a ratio of 0.3 based on the weight of the photo acid generating agent.

Used as an insulating body was a PTFE porous film having a pore diameter of 500 nm and a thickness of 20 $\mu$m, and the entire surface of the porous film was coated with the photosensitive composition by a dipping method. By this operation, the surfaces of the porous film including the surfaces of the pores inside the porous film were covered with the photosensitive composition.

Then, the porous sheet was exposed to light through a mask having various patterns having a line width of 3 $\mu$m to 100 $\mu$m and a dot diameter of 3 $\mu$m to 100 $\mu$m by using a CANON PLA501 so as to form a latent image. Light components having a wavelength not longer than 550 nm were shielded with a filter so as to use the visible light alone as the light for the light exposure. After formation of the latent image, the porous sheet was heated on a hotplate at 90° C. for 5 minutes so as to promote the de-protection reaction, thereby selectively generating ion-exchange groups on the light-exposed portion.

Measured were the minimum sizes of the dot patterns (vias) and the line patterns (wiring) formed on the surface of the PTFE porous film used as an insulating body. Also measured was the thickness in the depth direction of the formed dot pattern having a diameter of 50 $\mu$m. Table 14 shows the results together with the high molecular weight compounds used.

TABLE 14

| Sample | Dot ($\mu$m) | Line ($\mu$m) |
|---|---|---|
| D20 | 40 | 40 |
| D25 | 30 | 40 |

TABLE 14-continued

| Sample | Dot (μm) | Line (μm) |
|---|---|---|
| D30 | 20 | 25 |
| D35 | 15 | 20 |
| D40 | 20 | 25 |
| D50 | 20 | 30 |
| D70 | X | X |

Naphthyl imide.trifluoromethane sulfonate, which is not sensitized to light having a wavelength longer than, mainly, 500 nm, is considered to have been sensitized to visible light under the action of the photosensitizer. Therefore, it has been confirmed that it is possible to form a pattern even by exposure to visible light in the case of adding a photosensitizer to the photosensitive composition.

EXAMPLE II-7

Dependence of Molecular Weight

Since the experimental data for Example II-1 support that the monomer ratio for sample D35 is most excellent in pattern plating performance, prepared were five kinds of copolymers equal to each other in the ratio of tetrahydro methacrylate to methyl methacrylate and differing from each other in molecular weight. A photosensitive composition was prepared exactly as in Example II-1 by using the copolymer thus prepared, and pattern plating was performed as in Example II-1. Table 15 shows the weight average molecular weight Mw of the high molecular weight compounds and the patterning performance.

TABLE 15

| Run | Mw | Result of patterning (μm) | |
|---|---|---|---|
| | | Dot | Line |
| 1 | 115910 | 16 | 20 |
| 2 | 53241 | 12 | 14 |
| 3 (D35) | 41630 | 14 | 16 |
| 4 | 39566 | 18 | 20 |
| 5 | 15923 | 20 | 35 |

As shown in Table 15, the composition using the high molecular weight compound having a molecular weight of about 50,000 was most excellent in resolution performance. It is considered reasonable to understand that, where the monomer ratio is exactly the same, the solubility of the copolymer in the plating solution is increased with a decrease in the molecular weight of the copolymer, with the result that the copolymer having a lower molecular weight tends to elute easily into the plating solution. On the other hand, if the molecular weight of the copolymer is excessively high, it is difficult to maintain the uniformity in the wetting of the copolymer with the surface of the substrate.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a composite member having a conductive pattern, comprising:

(1) forming on a surface of an insulating body a photosensitive layer containing both a photosensitive compound forming an ion-exchange group or causing an ion-exchange group to disappear upon irradiation with an energy beam and a crosslinkable compound having a crosslinkable group;

(2) forming a pattern of ion-exchange groups by selectively exposing the photosensitive layer to an energy beam so as to form an ion-exchange group in the exposed portion or to cause an ion-exchange group to disappear from the exposed portion;

(3) crosslinking the crosslinkable compound contained in at least the exposed portion of the photosensitive layer;

(4) allowing metal ions, a metal compound, or a metal colloid to be adsorbed on the pattern of ion-exchange groups formed by the selectively exposing; and (5) forming a composite member having conductive pattern by depositing a conductive material on the pattern of ion-exchange groups having the metal ions, the metal compound, or the metal colloid adsorbed thereon using an electroless plating.

2. The method according to claim 1, wherein the crosslinkable group is capable of a radical polymerization, and the photosensitive layer further contains a radical generating agent.

3. The method according to claim 2, wherein at least one of the photosensitive compound and the radical generating agent is peroxide esters.

4. A method of manufacturing a composite member having a conductive pattern, comprising:

(1) forming on a surface of an insulating body a photosensitive layer containing a photosensitive polymer having both a photosensitive group capable of forming an ion-exchange group or causing an ion-exchange group to disappear upon irradiation with an energy beam and a crosslinkable group;

(2) forming a pattern of ion-exchange groups by selectively exposing the photosensitive layer to an energy beam so as to form an ion-exchange group in the exposed portion or to cause an ion-exchange group to disappear from the exposed portion;

(3) crosslinking the crosslinkable group contained in at least the exposed portion of the photosensitive layer;

(4) allowing metal ions, a metal compound, or a metal colloid to be adsorbed on the pattern of ion-exchange groups formed by the selectively exposing in a pattern; and (5) forming a composite member having conductive pattern by depositing a conductive material on the pattern of ion-exchange groups having the metal ions, the metal compound, or the metal colloid adsorbed thereon using electroless plating.

5. The method according to claim 4, wherein the crosslinkable group is capable of a radical polymerization, and said photosensitive layer further contains a radical generating agent.

6. The method according to claim 5, wherein at least one of said photosensitive polymer and said radical generating agent is peroxide esters.

7. A photosensitive composition, comprising:

a polymer having a photosensitive group forming an ion-exchange group upon irradiation with an energy beam and an crosslinkable group capable of a radical polymerization; and a radical generating agent.

8. The photosensitive composition according to claim 7, wherein said crosslinkable group capable of a radical polymerization is at least one crosslinkable group selected from the group consisting of a vinyl group, an acryloyl group, a methacryloyl group and a maleimidyl group.

9. A porous substrate, comprising:
a porous body having voids; and
a photosensitive layer formed on the inner surface of the voids,
wherein the photosensitive layer containing a composition having both a photosensitive compound capable of forming an ion-exchange group or causing an ion-exchange group to disappear upon irradiation with an energy beam and a crosslinkable compound, or containing a photosensitive polymer having both photosensitive group capable of forming an ion-exchange group or causing an ion-exchange group to disappear upon irradiation with an energy beam and a crosslinkable group.

10. A porous substrate, comprising:
a porous body having voids; and
a photosensitive layer formed on the inner surface of the voids,
wherein the photosensitive layer contains a polymer having a photosensitive group capable of generating an ion-exchange group upon irradiation with an energy beam and a radical polymerizable group, and a radical generating agent.

11. A method of manufacturing a composite member having a conductive pattern, comprising:
(1) forming on a surface of an insulating body a photosensitive layer containing a photo acid generating agent and a compound forming an ion-exchange group in the presence of an acid;
(2) selectively exposing said photosensitive layer to an energy beam so as to generate an acid in the exposed portion;
(3) forming a pattern of ion-exchange groups by allowing the acid generated by the selectively exposing in the exposed portion of the photosensitive layer to form an ion-exchange group; and
(4) forming a composite member having conductive pattern by allowing a metal ion, a metal compound, or a metal colloids to be adsorbed on the pattern of ion-exchange groups,
wherein the compound forming an ion-exchange group in the presence of the acid is a copolymer having a first repeating unit having ion-exchange groups and a second repeating unit having an atomic group not decomposed by an acid and insoluble in an alkali, and some or all of said ion-exchange groups are protected by a protective group.

12. The method according to claim 11, further comprising:
(5) depositing a conductive material on the pattern of ion exchange groups having the metal ion, a metal compound or a metal colloids adsorbed thereon using an electroless plating.

13. The method according to claim 11, wherein the compound forming an ion-exchange group in the presence of the acid is a polymer having an acryl skeleton and/or styrene skeleton on the backbone chain.

14. The method according to claim 11, wherein the compound forming an ion-exchange group in the presence of the acid has at least one atomic group selected from the group consisting of a sulfonium ester group, a carboxylic acid ester group and a phenol derivative group.

15. The method according to claim 11, wherein the compound forming an ion-exchange group in the presence of the acid has a tetrahydropyranyl group, a t-butyl group or a t-butoxy carbonyl methyl group as a protective group for protecting said ion-exchange group.

16. The method according to claim 11, wherein said atomic group not decomposed by the acid and insoluble in the alkali of said second repeating unit is a crosslinkable group.

17. A photosensitive composition comprising,
a photo acid generating agent, a high molecular weight compound capable of forming ion-exchange groups in the presence of an acid, and a photosensitizer,
wherein the photosensitive composition is sensitive to light having a wavelength not shorter than 450 nm,
said high molecular weight compound is a copolymer having a first repeating unit having ion-exchange groups and a second repeating unit having an atomic group not decomposed by an acid and insoluble in an alkali, and
some or all of said ion-exchange groups are protected by a protective group.

18. The photosensitive composition according to claim 17, wherein said atomic group not decomposed by an acid and insoluble in an alkali of said second repeating unit of said high molecular compound is a crosslinkable group.

19. An insulating body used for the manufacture of a composite member having a conductive pattern comprising a porous body and the coating layer on the inner surface of the pore of said porous body, wherein the coating layer formed with the photosensitive composition defined in claim 17.

* * * * *